(12) United States Patent  
Higashino

(10) Patent No.: US 8,378,415 B2  
(45) Date of Patent: Feb. 19, 2013

(54) SEMICONDUCTOR DEVICE AND METHOD OF MANUFACTURING SEMICONDUCTOR DEVICE

(75) Inventor: Toshiyuki Higashino, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 563 days.

(21) Appl. No.: 12/183,471

(22) Filed: Jul. 31, 2008

(65) Prior Publication Data

US 2009/0032849 A1 Feb. 5, 2009

(30) Foreign Application Priority Data

Aug. 1, 2007 (JP) ................................. 2007-200868

(51) Int. Cl.  
*H01L 29/66* (2006.01)
(52) U.S. Cl. ............ 257/329; 257/E21.41; 257/E29.262
(58) Field of Classification Search .................. 257/262, 257/E21.41, E29.262  
See application file for complete search history.

(56) References Cited

U.S. PATENT DOCUMENTS 4,929,568 A * 5/1990 Beasom et al. ............... 438/176  
5,296,727 A * 3/1994 Kawai et al. .................. 257/260

FOREIGN PATENT DOCUMENTS

| JP | 06-021467 | 1/1994 |
|---|---|---|
| JP | 06-244419 | 9/1994 |
| JP | 09-008290 | 1/1997 |
| JP | 2003-229494 | 8/2003 |
| JP | 2005-064031 | 3/2005 |
| JP | 2005-197704 | 7/2005 |

* cited by examiner

*Primary Examiner* — Julio J Maldonado  
*Assistant Examiner* — Amar Movva  
(74) *Attorney, Agent, or Firm* — Scully, Scott, Murphy & Presser, P.C.

(57) ABSTRACT

A semiconductor device includes a cylindrical main pillar that is formed on a substrate and of which a central axis is perpendicular to the surface of the substrate, source and drain diffused layers that are formed in a concentric shape centered on the central axis at upper and lower portions of the main pillar and made from a first-conduction-type material, a body layer that is formed at an intermediate portion of the main pillar sandwiched between the source and drain diffused layers and made from the first-conduction-type material, and a front gate electrode that is formed on a lateral face of the main pillar while placing a gate insulating film therebetween. Moreover, a back gate electrode made from a second-conduction-type material is formed in a pillar shape penetrating from an upper portion to a lower portion on an inner side of the main pillar.

20 Claims, 12 Drawing Sheets

SEMICONDUCTOR DEVICE AND METHOD OF MANUFACTURING SEMICONDUCTOR DEVICE

BACKGROUND OF THE INVENTION

1. Field of the Invention

The present invention relates to a semiconductor device and a method of manufacturing the semiconductor device. More particularly, the present invention relates to a semiconductor device having a vertical surround gate transistor (SGT) structure and a method of manufacturing the semiconductor device.

Priority is claimed on Japanese Patent Application No. 2007-200868, filed Aug. 1, 2007, the content of which is incorporated herein by reference.

2. Description of Related Art

In recent years, semiconductor technology has been applied over a wide range. High integration and low power consumption are strongly requested in integrated circuits from a general electronic equipment such as a dynamic random access memory (DRAM) and a central processing unit (CPU) to a special purpose for an automotive engine control and a universal satellite. In order to realize drastic high integration for semiconductor integrated circuits, there has been expected a new-structure transistor alternative to a conventional planar-type metal oxide semiconductor (MOS) transistor.

As an example of the new-structure transistor, there has been known a device using a silicon on insulator (SOI) wafer instead of a conventional silicon wafer. As shown in FIG. 11, a complementary MOS (SOI-CMOS) transistor 101 is formed on an SOI wafer 102. The wafer 102 includes a single crystal silicon wafer 102a, an embedded oxide film 102b, and a silicon layer 102c that are sequentially stacked therein. Here, the SOI-CMOS transistor 101 comprises a source region 103 and a drain region 104 formed in the silicon layer 102c, a body region 105 arranged between the source region 103 and the drain region 104, a gate insulating film 106 made from silicon oxide formed on the body region 105, and a gate electrode 107 made from poly-silicon formed on the gate insulating film 106. The source region 103 and the drain region 104 are impurity-diffused regions that are formed by ion-implanting n-type impurities in the silicon layer 102c. On the other hand, the body region 105 is an impurity-diffused region that is formed by ion-implanting p-type impurities in the silicon layer 102c. Side walls 108 made from silicon nitride are formed on both sides of the gate electrode 107. Furthermore, an interlayer insulation film 109 made from silicon oxide is stacked so as to cover the gate electrode 107 and the silicon layer 102c. Contact plugs 110a, 110b, and 110c are respectively connected to the gate electrode 107, the source region 103, and the drain region 104, and are formed in the interlayer insulation film 109.

According to the above SOI-CMOS transistor, the silicon layer 102c having an impurity-diffused region such as the body region 105 is insulated by the embedded oxide film 102b from the silicon wafer 102a. According to this, reduction of parasitic capacitance, prevention of latch-up, reduction of junction leakage, and suppression of short channel effect are accomplished. However, the SOI wafer is expensive compared to the conventional single crystal silicon wafer. For this reason, it is required for a transistor that uses the conventional single crystal silicon wafer to have the same characteristic as that of the SOI-CMOS transistor. The SOI wafer has a problem in that a self-heating effect occurs because thermal conductivities of the embedded oxide film and the silicon layer are largely different. Therefore, there is required a transistor in which heat generated by itself is effectively released similar to a conventional substrate. Furthermore, there is required a structure that can be applied to a floating-body-type transistor or the like that is used for a memory cell of capacitorless DRAM by making a design technique of a conventional transistor exploit. This structure can separate a substrate region and a body region so that many holes made by impact ionization can accumulate. However, manufacture of this structure has a problem in that it is difficult to dope by a conventional ion implantation.

Moreover, a planar-type MOS transistor having a conventional structure is improved according to the development of new materials for a high-k gate insulating film, a metal gate electrode, and so on. However, with a request of high integration for integrated circuits, a gate length has been reduced year by year. Within the next 20 years, it is thought that this integration necessarily reaches a limit. There is required development of mass production techniques to hold or improve ON currents with keeping Moore's law for a future. For this purpose, there is needed a structure that improves strict control for a distribution of dopant and control for a gate. For that purpose, it is necessary to form a source region, a drain region, and a body region that are obtained by controlling the distribution of dopant in a nanometer scale and strictly divide the regions.

On the other hand, if the body region has a channel formed therein, electric currents can not be controlled using only the small gate region. For this reason, a short channel effect occurs. It is necessary to guarantee a large gate region to form a channel in the whole silicon body region. Then, it is necessary to control electric currents and restrain a short channel effect. However, a planar-type transistor that is a conventional all-around gate transistor has complicated manufacturing processes.

On the other hand, as a vertical all-around gate transistor capable that is easily manufactured, there is developed a surround gate transistor (SGT) having a structure which is obtained by winding a gate insulating film and a gate electrode around a silicon pillar including source and drain regions and a channel region (refer to Japanese Unexamined Patent Application, First Publication No. H06-21467, No. H06-244419, No. H09-8290, No. 2005-64031, No. 2005-197704 and No. 2003-229494).

As shown in FIG. 12, a conventional SGT transistor 201 has a silicon layer 203 having a cylinder (pillar) shape, source and drain regions 204a and 204b positioned at upper and lower portions thereof, and a body region 205 positioned between the source and drain regions 204a and 204b. The SGT transistor 201 further has a gate insulating film 206 that covers the body region 205 around the silicon layer 203 and a gate electrode 207 via the gate insulating film 206. The source and drain regions 204a and 204b are impurity-diffused regions that are formed by ion-implanting n-type impurities in the silicon layer 203. On the other hand, the body region 205 is an impurity-diffused region that is formed by ion-implanting p-type impurities in the silicon layer 203.

However, a diameter of the silicon pillar must be increased to sufficiently guarantee the channel in the body region, in order to increase ON currents in the structure of such SGT transistor 201. For this reason, an increase efficiency of ON currents per unit area is low. Further, it becomes a problem that a threshold voltage changes because the diameter of silicon pillar becomes wide as a result.

Moreover, as the other transistor, a fin-type field effect transistor (Fin FET) has been known. In order to improve ON currents in the Fin FET, the silicon layer forming the channel must be thicker or be increased in a lateral direction. Therefore, Fin FET has a disadvantage in an area efficiency in the case of combination with or substitution of a conventional planar-type transistor. Moreover, when manufacturing a transistor with an ultrashort channel length, it is disadvantageous to form the ultrashort channel length because conventional ion-implantation processes are used. Since the shape of the transistor becomes higher in a direction perpendicular to the substrate or becomes longer in a direction of the substrate, the Fin FET has an unbalanced shape in which an original feature of the Fin FET cannot be utilized. For this reason, there is a problem in that it is difficult to manufacture itself.

Therefore, a double-gate transistor having a structure of a vertical transistor has been developed. The double-gate transistor has a structure by which leakage currents can be restrained when turning off the transistor by controlling the electric currents with two gates.

However, in the vertical double-gate transistor, its channel width must be lengthened to improve ON currents. For that purpose, gate electrodes must be arranged on both sides of the silicon layer forming the channel so as to sandwich the silicon layer. For this reason, there is a problem in that an occupied area per unit wafer area of the transistor becomes large.

SUMMARY

The present invention seeks to solve one or more of the above problems, or to improve those problems at least in part.

The present invention has been achieved in view of the situation above, and the object is to provide a semiconductor device having a surround gate transistor with junction (SGTJ) structure of the vertical double-gate transistor by which a channel length can be ultrashort, and thus ON currents can be increased without changing the threshold value by holding a silicon layer thickness constant and further the threshold value can also be dynamically changed by a back gate. The present invention also provides a method for manufacturing the above semiconductor device.

The semiconductor device according to an embodiment of the present invention has the SGTJ structure in which one of two gate electrodes has a pillar shape and is embedded in the center of a main pillar. In this way, since small electrodes can be formed and thus the channel length can be ultrashort, ON currents can be improved without changing the threshold value while reducing the occupied area per unit wafer area.

Further, the embodiment of the present invention provides a transistor equal to that using an SOI substrate, which can realize the reduction of parasitic capacitance, the prevention of latch-up, the reduction of junction leakage, and the suppression of short channel effect at low cost without using the SOI substrate.

In one embodiment, there is provided a semiconductor device that comprises: a cylindrical main pillar that is formed on a substrate; source and drain diffused layers that are formed in a concentric shape at upper and lower portions of the main pillar and made from a first-conduction-type material; a body layer that is formed at an intermediate portion of the main pillar sandwiched between the source and drain diffused layers and made from the first-conduction-type material; a front gate electrode that is formed on a outer surface of the main pillar while placing a gate insulating film therebetween; and a back gate electrode that is formed inside the main pillar and comes in contact with the source and drain diffused layers and the body layer.

In one embodiment, there is provided a method for manufacturing a semiconductor device, the method comprises: sequentially forming, on a substrate, a first-conduction-type first semiconductor film that becomes an upper potion of source and drain layers, a first-conduction-type second semiconductor film that becomes a body layer including a channel region, and a first-conduction-type third semiconductor film that becomes a lower portion of the source and drain layers; removing central axis portions of the third semiconductor film, the second semiconductor film, and the first semiconductor film to form a pillar-shaped hole penetrating from an upper portion of the third semiconductor film to a lower portion of the first semiconductor film and forming a back gate electrode made from a second-conduction-type material in the hole; patterning the third semiconductor film, the second semiconductor film, and a part of the first semiconductor film to form a shape of which a cross section is substantially convex and form a concentric shape with a focus on a central axis when seeing a surface of the substrate from above, and thus forming a cylindrical main pillar; forming a gate insulating film to cover at least an outer surface of the body layer; and forming a front gate electrode at an outer circumferential portion of the body layer while placing the gate insulating film therebetween.

In one embodiment, there is provided a method for manufacturing a semiconductor device according to the present invention, the method comprises: sequentially forming, on a substrate, a first-conduction-type first semiconductor film that becomes an upper potion of source and drain layers, a first-conduction-type second semiconductor film that becomes a body layer including a channel region, and a first-conduction-type third semiconductor film that becomes a lower portion of the source and drain layers; removing central axis portions of the third semiconductor film, the second semiconductor film, and the first semiconductor film to form a pillar-shaped hole penetrating from an upper portion of the third semiconductor film to a lower portion of the first semiconductor film and forming a gate insulating film so as to cover at least an inner surface of the body layer in an inner surface of the hole; forming a front gate electrode at an inner circumferential portion of the body layer while placing the gate insulating film therebetween; patterning the third semiconductor film, the second semiconductor film, and a part of the first semiconductor film to form a shape of which a cross section is substantially convex and form a concentric shape with a focus on a central axis when seeing a surface of the substrate from above, and thus forming a cylindrical main pillar; and forming a back gate electrode made from a second-conduction-type material on an outer surface of the main pillar.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE INVENTION

The invention will be described herein with reference to illustrative embodiments. Those skilled in the art will recognize that many alternative embodiments can be accomplished using the teachings of the present invention and that the invention is not limited to the embodiments illustrated here for explanatory purposes.

In addition, the drawings to be referred to in the following descriptions are views to explain the semiconductor device of the present embodiment, and therefore the magnitude such as the size or the thickness of each portion illustrated may be different from that of each portion of a real semiconductor device.

[Basic Example of Semiconductor Device]

Figure 1:
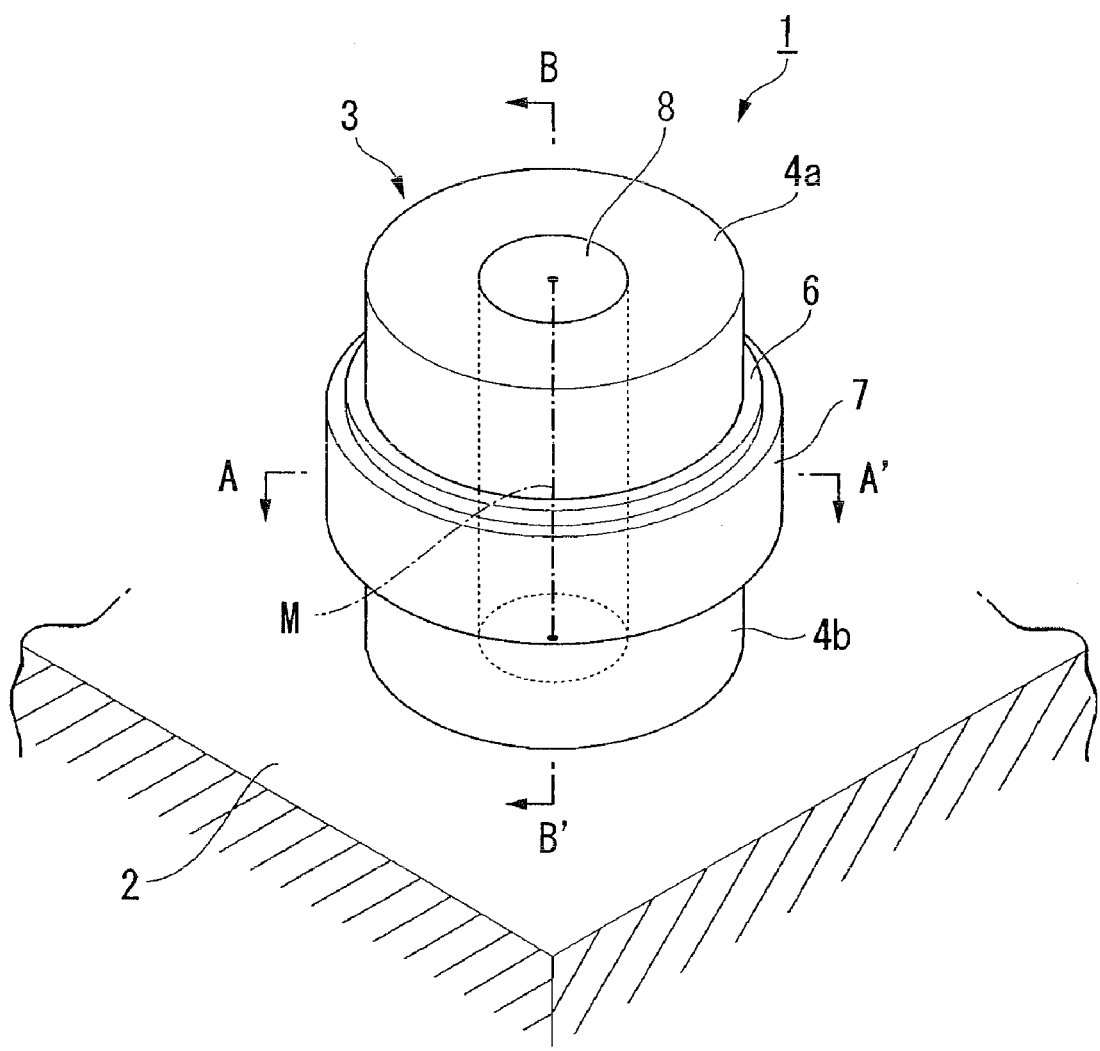
FIG. 1 is a perspective view showing a semiconductor device according to an embodiment of the present invention.
Figure 2A:
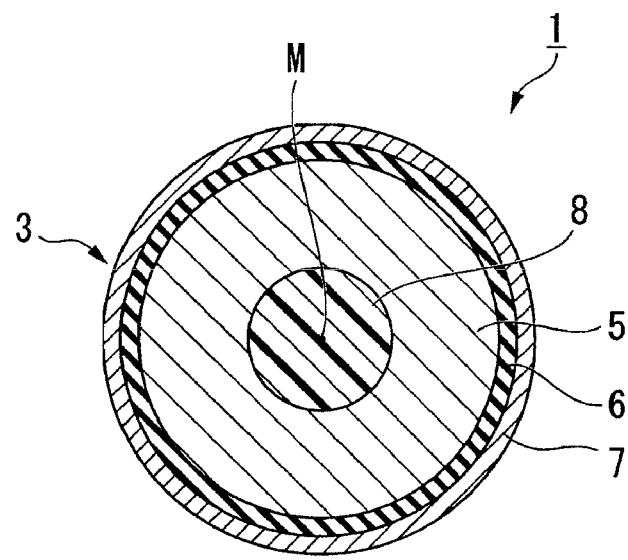
FIG. 2A is a cross-sectional view showing the semiconductor device according to the embodiment of the present invention, taken along an A-A' line shown in FIG. 1.
Figure 2B:
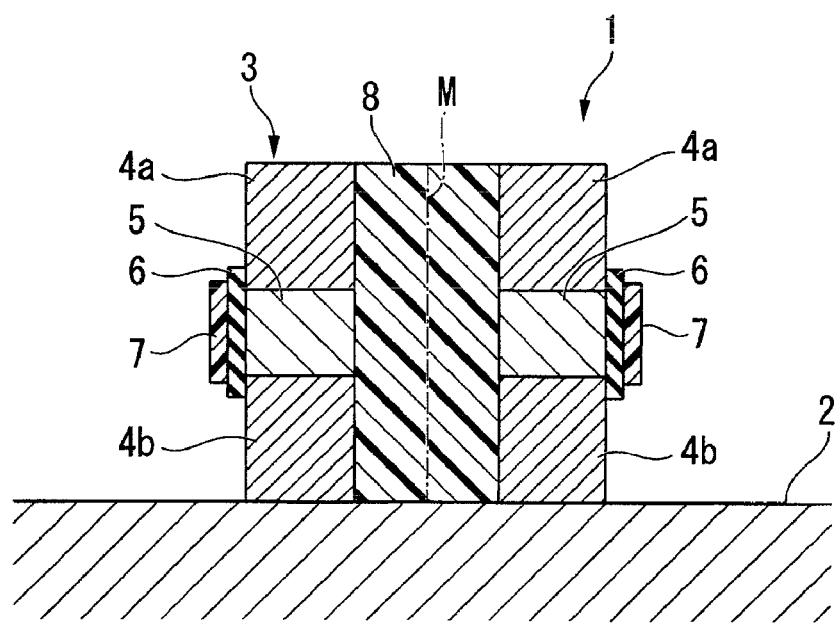
FIG. 2B is a cross-sectional view showing the semiconductor device according to the embodiment of the present invention, taken along a B-B' line shown in FIG. 1.

It will be described about a basic example of the semiconductor device of the present embodiment with reference to FIG. 1, FIG. 2A, and FIG. 2B. FIG. 1 shows a perspective view of a structure of a principal part of the semiconductor device (SGTJ transistor) according to the present embodiment. Moreover, FIG. 2A shows a cross-sectional view taken along an A-A' line shown in FIG. 1 and viewed from a direction seeing a surface of a semiconductor substrate from above, and FIG. 2B shows a cross-sectional view taken along a B-B' line shown in FIG. 1.

The semiconductor device 1 shown in FIG. 1 comprises a cylindrical main pillar 3 that is formed on a substrate 2 and of which a central axis M is perpendicular to the surface of the substrate 2, source and drain diffused layers 4a and 4b that are formed in a concentric shape centered on the central axis M at upper and lower portions of the main pillar 3 and made from a first-conduction-type material, a body layer 5 (see FIGS. 2A and 2B) that is formed at an intermediate portion of the main pillar 3 sandwiched between the source and drain diffused layers 4a and 4b and made from the first-conduction-type material, a front gate electrode 7 that is formed on an outer surface of the main pillar 3 to cover the body layer 5 while placing a gate insulating film 6 therebetween, and a back gate electrode 8 that is connected with the source and drain diffused layers 4a and 4b and the body layer 5 in a p-n junction manner while being formed in a pillar shape penetrating from the upper portion to the lower portion in an inner surface of the main pillar 3 and made from a second-conduction-type material.

By such a structure, an outside diameter can be increased while holding the same threshold voltage. For this reason, it is possible to realize a vertical metal oxide semiconductor (MOS) transistor having a wide channel width in which ON currents can be improved.

A conventional planar-type MOS structure must set the doping concentration of a source, a drain, a lightly doped drain (LDD), a pocket, and the body layer so that a threshold value is not changed in spite of the change of a channel length. However, in the vertical MOS structure, the thickness of a silicon layer is also related to a threshold value. In order not to largely change the threshold value in spite of the change of the thickness of silicon layer, the thickness of the silicon layer must be held. For this reason, it is preferable to have a structure in that the silicon layer forming a channel has a cylindrical shape and a concentric shaped cross section.

On the other hand, an arbitrary threshold voltage in the same channel length can be realized by freely changing the thickness of silicon layer. For this purpose, although a conventional ion implantation method requires a plurality of ion implantation processes, it can be realized by a single etching manufacturing process in the semiconductor device of the present invention.

The back gate electrode 8 made from the second-conduction-type material can function like a back gate of a conventional double gate by applying a reverse bias to the back gate electrode to change a threshold voltage without flowing an electric current even when a voltage is applied to body layer 5. Thus, the threshold voltage can be dynamically raised or lowered. According to this, leakage currents when turning off the transistor can be decreased. The source and drain diffused layers 4a and 4b and the body layer 5 of the transistor should be formed of the first-conduction-type material. The reason is that the transistor becomes a bipolar transistor when the body layer 5 is formed of the second-conduction-type material different from the first-conduction-type material, and thus electric currents flow from the back gate electrode 8 to the body layer 5.

The front gate electrode 7 is arranged at the outer side of the main pillar 3, and the back gate electrode 8 is formed on the inner side of the main pillar 3 in a pillar shape penetrating from the upper portion to the lower portion. When this is done, since it is not necessary to provide a gate oxide film on the inner side, it is possible to make a precision of a manufacturing process easy. In general, it is necessary that inside and outside gate oxide films have the same oxide film thickness, in order to simultaneously operate the inside and outside gates. However, an oxide film such as a thermal oxide film cannot realistically have the same oxide film thickness from the reason of thermal radiation. Therefore, it is suitable for the inside gate to have a structure by which the gate does not depend on the film thickness of the oxide film. For this reason, the inside and outside gates are manufactured to have different structures, and thus an inside reverse bias junction gate dynamically changes a threshold voltage. Then, gate operations of a conventional transistor are performed by the outside gate. In this way, a high speed and low power consumption transistor can be made and be used as an improved SGT. As described above, it turns out that the inside gate structure has margin width for a process and a process precision is suitable for a vertical transistor structure.

As shown in FIG. 2A and FIG. 2B, the layers (the source and drain diffused layers 4a and 4b and the body layer 5) of the main pillar 3 are concentrically formed with a focus on the central axis M. In doing so, it is possible to realize a structure by which a transistor becomes a shape suitable for relaxation of an electric field and has channel width that can be easily increased. When this structure has a constant silicon layer thickness in a state of constant doping concentration, an outside diameter of a silicon cylinder, that is to say, a channel width, can be increased compared to the SGT structure while holding the threshold voltage. Therefore, ON currents can be improved. When the silicon layer forming the channel is formed in a concentric doughnut-shaped silicon cylinder with a long channel width, an increase efficiency of ON currents per unit wafer area is higher than that of ON currents of SGT. A conventional SGT structure has a complicated design in order to hold the same threshold voltage even if the silicon layer thickness and channel width are changed. For this reason, in order to obtain high ON currents per unit wafer area with keeping a good transistor characteristic, it is necessary to have a concentric doughnut-shaped structure with a long channel width like the semiconductor device of the present invention. Furthermore, high ON currents can be realized in the vertical metal oxide semiconductor transistor. As a result, this results in a transistor structure suitable for a memory cell such as a phase change memory (PRAM) that requires large ON currents.

It is preferable that the body layer 5 also has the same concentric shape as that of the source and drain diffused layers 4a and 4b. It is preferable that a surface of the body layer 5 is parallel to a p-n junction boundary between the back gate electrode 8 and the body layer 5. In doing so, it is possible for the region (the body layer 5) forming the channel to have a concentric shape, the gate width of the transistor is enlarged without enlarging an outline dimension, and ON currents are increased.

Figure 8:
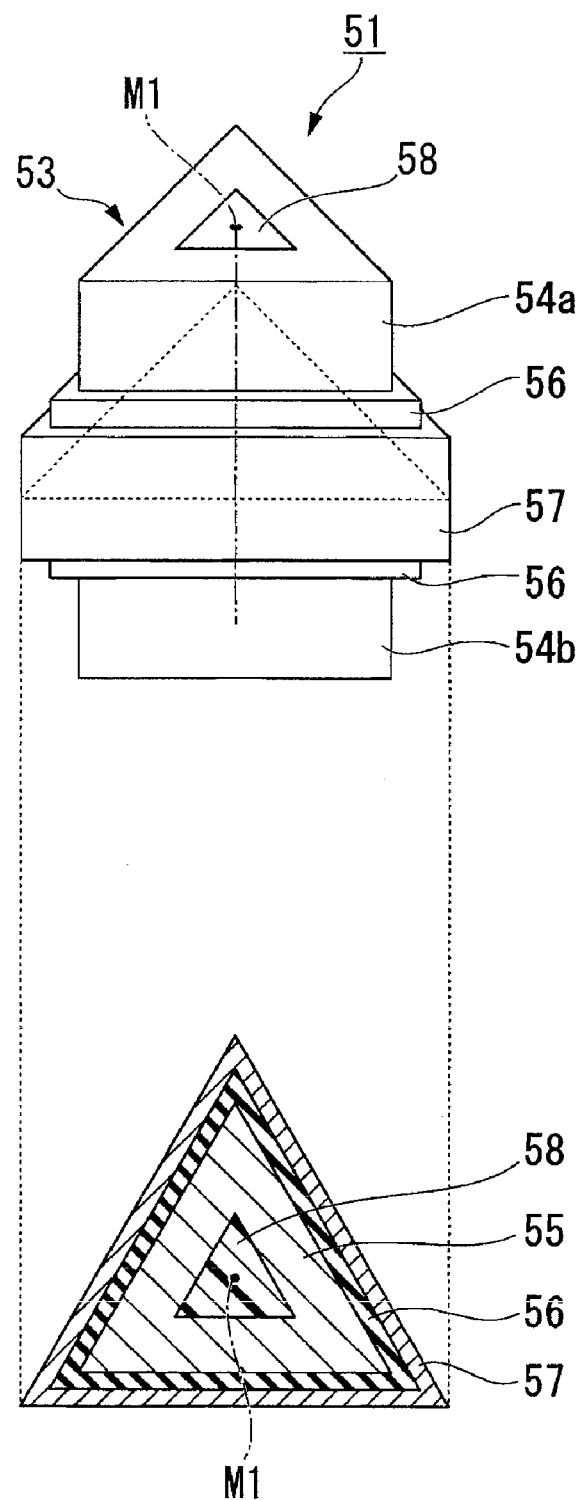
FIG. 8 shows a substantial part of the semiconductor device according to the embodiment of the present invention.
Figure 9:
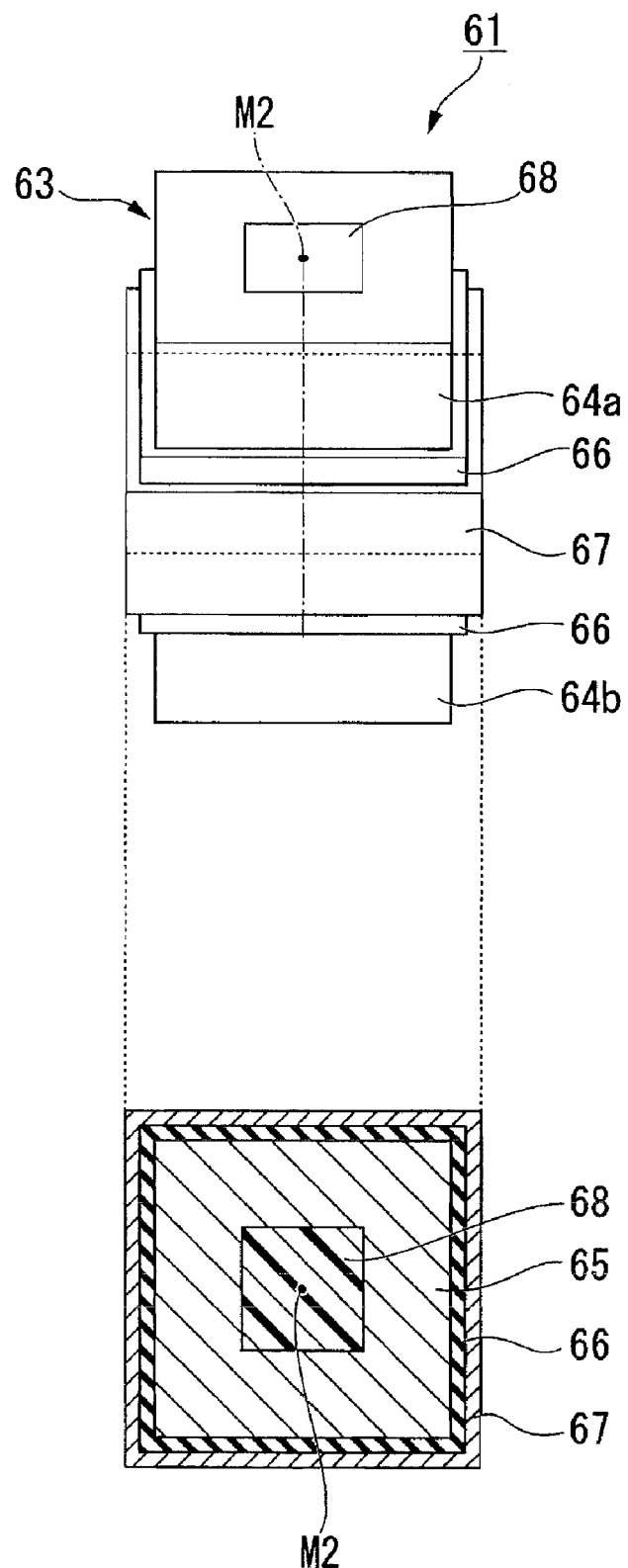
FIG. 9 shows a substantial part of the semiconductor device according to the embodiment of the present invention.

Moreover, it is preferable that the layers (the source and drain diffused layers 4a and 4b and the body layer 5) of the main pillar 3 have constant width in transverse sections thereof and have a constant height in longitudinal sections thereof. In doing so, it is possible to have a constant silicon layer thickness and a constant threshold voltage by a low doping concentration. Furthermore, since the outside diameter of the silicon cylinder can be increased while holding the constant silicon layer thickness, ON currents can be improved. Moreover, it is preferable that the gate insulating film 6 for covering the body layer 5 to surround the body layer 5 also has a constant film thickness. Further, it is preferable that the front gate electrode 7 for covering the gate insulating film 6 is also arranged to have the same height position and the same vertical length as those of the body layer 5 and is formed to have the same film thickness. A cross-sectional shape viewed from the direction seeing the surface of the substrate 2 from above is not particularly limited. In addition to a circle as shown in FIG. 2A, the shape may be a triangle as shown in FIG. 8, or may be a quadrangle as shown in FIG. 9. Due to an influence of parasitic capacitance or the like, the width of the front gate electrode 7 parallel to the substrate 2 is also a factor which is important in view of performance improvement. For this reason, it is important that the source and drain diffused layers 4a and 4b protruding from the body layer 5 are largely separated from the front gate electrode 7. Therefore, it is preferable to lengthen the source and drain diffused layers 4a and 4b in the direction perpendicular to the substrate 2 and thus largely separate them from the front gate electrode 7.

A semiconductor device 51 shown in FIG. 8 comprises a main pillar 53 that is formed on a substrate to have a central axis M1 perpendicular to a surface of the substrate and of which a cross-sectional shape is a triangle cylindrical shape when seeing the surface of the substrate from above, source and drain diffused layers 54a and 54b that are formed at upper and lower portions of the main pillar 53 in a concentric shape centered on the central axis M1 and made from a first-conduction-type material; a body layer 55 that is formed at a central portion of the main pillar 53 sandwiched between the source and drain diffused layers 54a and 54b and made from the first-conduction-type material; a front gate electrode 57 that is formed to cover the body layer 55 on an outer surface of the main pillar 53 while placing a gate insulating film 56 therebetween; and a back gate electrode 58 that is formed on an inner surface of the main pillar 53 in a pillar shape penetrating from the upper portion to the lower portion, is connected with the source and drain diffused layers 54a and 54b and the body layer 55 in a p-n junction manner, and is made from a second-conduction-type material. It is preferable that the body layer 55 has the same concentric shape as that of the source and drain diffused layers 54a and 54b. It is preferable that the body layer 55 has a constant width in a transverse section of the main pillar 53 surrounded by the front gate electrode 58 and has a constant height in a longitudinal section thereof. Furthermore, it is preferable that the gate insulating film 56 also has a constant film thickness.

A semiconductor device 61 shown in FIG. 9 comprises a main pillar 63 that is formed on a substrate to have a central axis M2 perpendicular to a surface of the substrate and of which a cross-sectional shape is a square cylindrical shape when seeing the surface of the substrate from above, source and drain diffused layers 64a and 64b that are formed at upper and lower portions of the main pillar 63 in a concentric shape centered on the central axis M2 and made from a first-conduction-type material, a body layer 65 that is formed at a central portion of the main pillar 63 sandwiched between the source and drain diffused layers 64a and 64b and made from the first-conduction-type material, a front gate electrode 67 that is formed to cover the body layer 65 on an outer surface of the main pillar 63 while placing a gate insulating film 66 therebetween, and a back gate electrode 68 that is formed on an inner surface of the main pillar 63 in a pillar shape penetrating from the upper portion to the lower portion, is connected with the source and drain diffused layers 64a and 64b and the body layer 65 in a p-n junction manner, and made from a second-conduction-type material. It is preferable that the body layer 65 has the same concentric shape as that of the source and drain diffused layers 64a and 64b. It is preferable that the body layer 65 has a constant width in a transverse section of the main pillar 63 surrounded by the front gate electrode 68 and has a constant height in a longitudinal section thereof. Furthermore, it is preferable that the gate insulating film 66 also has a constant film thickness.

The source and drain diffused layers 4a, 4b, 54a, 54b, 64a, and 64b and the body layers 5, 55, and 65 made from the first-conduction-type material may be n-type doped silicon, and the back gate electrodes 8, 58, and 68 made from the second-conduction-type material may be p-type doped silicon. On the other hand, the source and drain diffused layers 4a, 4b, 54a, 54b, 64a, and 64b and the body layers 5, 55, and 65 made from the first-conduction-type material may be, for example, p-type doped silicon, and the back gate electrodes 8, 58, and 68 made from the second-conduction-type material may be, for example, n-type doped silicon.

In regard to the gate electrode, a plurality of gate electrodes may be provided in a direction perpendicular to the surface of the body layers 5, 55 and 65, and capacitance may be provided in source layers (the source and drain diffused layers 4a, 54a, and 64a) between the gate electrodes. According to this, it is possible to realize a multivalued DRAM which uses the plurality of gate electrodes from only one drain layer (the source and drain diffused layers 4b, 54b, and 64b). Further, the gate insulating films 6, 56, and 66 may be respectively formed on inner surfaces of the main pillars 3, 53, and 63, the front gate electrodes 7, 57, and 67 may be respectively formed on the insides thereof, and the back gate electrodes 8, 58, and 68 may be respectively formed on outer surfaces of the main pillars 3, 53, and 63, so as to have a reverse function of the gate electrode.

[Example of Semiconductor Device]

Figure 3:
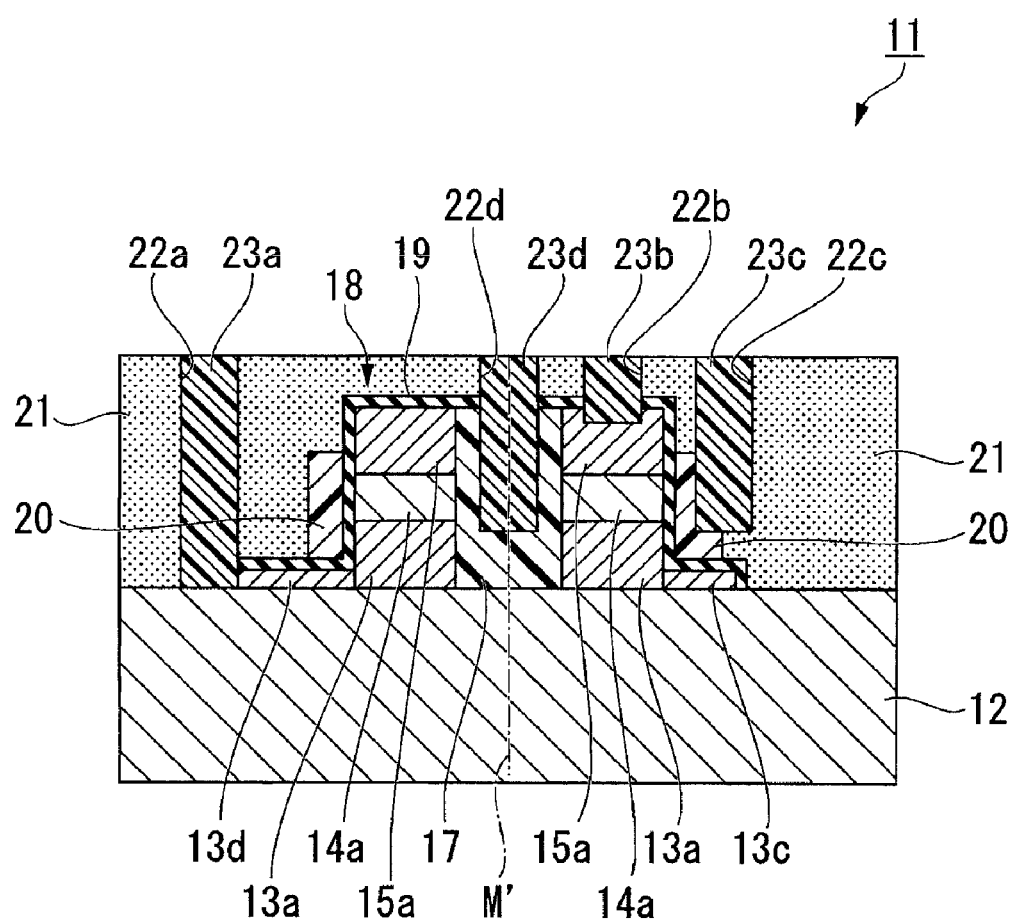
FIG. 3 is a cross-sectional schematic view exemplary showing the semiconductor device according to the embodiment of the present invention.

FIG. 3 shows an example of a concrete configuration of the semiconductor device 1 shown in FIG. 1, FIG. 2A, and FIG. 2B. A semiconductor device 11 shown in FIG. 3 includes a cylindrical main pillar 18 that is formed on a substrate 12 to have a central axis M' perpendicular to a surface of the substrate 12; a source layer 15a and a drain layer 13a that are formed at upper and lower portions of the main pillar 18 in a concentric shape centered on the central axis M' and made from an n$^+$-type (first-conduction-type) material; a body layer 14a that is formed at a central portion of the main pillar 18 sandwiched between the source layer 15a and the drain layer 13a, and made from the n-type (first-conduction-type) material; a front gate electrode 20 that is formed on an outer surface of the main pillar 18 to cover the body layer 14a while placing a gate insulating film 19 therebetween; and a back gate electrode 17 that is formed on an inner surface of the main pillar 18 in a pillar shape penetrating from the upper portion to the lower portion, that is connected with the source layer 15a, the drain layer 13a, and the body layer 14a in a p-n junction manner, and that is made from a p-type (second-conduction-type) material. Drawn electrode portions 13c and 13d drawing an electrode are formed to protrude from the lower portion of the drain layer 13a to its outer circumferential direction. In this manner, since the lower and upper portions of the drain layer 13a are sufficiently separated, parasitic capacitance of the drain layer 13a and the gate (body layer 14a) can be largely reduced and positioning of an electrode and a wire can be easily performed.

In this manner, since the drawn electrode portions 13c and 13d are formed, the drain layer 13a can be formed to have a structure that largely protrudes in a transverse direction in comparison with the body layer 14a and the source layer 15a, and thus a poly-silicon wire can be easily performed. At this time, the front gate electrode 20 made from poly-silicon can be formed on a silicon oxide insulating layer that functions as an etching stop layer (not shown). Due to an influence of parasitic capacitance or the like, the width of the gate electrode 68 parallel to the substrate 12 is also the factor which is important to performance improvement. For this reason, it is important to largely separate the source layer 15a and the drain layer 13a protruding from the body layer 14a from the front gate electrode 20. In this manner, since the drawn electrode portions 13c and 13d are provided, the drain layer 13a can be lengthened in a direction perpendicular to the substrate 12 and thus be largely separated from the front gate electrode 20.

The front gate electrode 20 made from poly-silicon can be formed on a silicon oxide insulating layer that functions as an etching stop layer (not shown). Due to an influence of parasitic capacitance or the like, the width of the front gate electrode 20 parallel to the substrate 12 is also the factor which is important to performance improvement. For this reason, it is important to largely separate the drain layer 13a and the source layer 15a protruding from the body layer 14a from the gate electrode. In this manner, since the drawn electrode portions are provided, the drain layer 13a can be lengthened in a direction perpendicular to the substrate and be largely separated from the front gate electrode 20.

An interlayer insulation film 21 is deposited on the entire surface of the substrate 12. A contact hole 22a connected to the drain layer 13a is formed at the outer side of the drawn electrode portion 13d. A contact hole 22b connected to the source layer 15a is formed on the upper portion of the source layer 15a. A contact hole 22c connected to the front gate electrode 20 is symmetrically formed at the opposite side of the contact hole 22a so as to be contacted at the lateral face of the front gate electrode 20. A contact hole 22d connected to the back gate electrode 17 is formed in the upper portion of the back gate electrode 17. The contact holes 22a, 22b, 22c, and 22d include therein poly-silicon that is amorphous silicon doped with n-type or p-type impurities (P and As, or B), and contact plugs 23a, 23b, 23c, and 23d are respectively formed in the contact holes. The contact holes 22a, 22b, 22c, and 22d may include therein tungsten (W) instead of the poly-silicon, and the contact plugs 23a, 23b, 23c, and 23d may be respectively formed in the contact holes. In addition, wires are respectively connected to the contact plugs 23a, 23b, 23c, and 23d. Since the first wire (the contact plug 23c) wired to the front gate electrode 20 and the second wire (the contact plug 23a) wired to the drawn electrode portion 13d are symmetrically arranged at the outer side of the main pillar 18, the parasitic capacitance can be reduced. Moreover, since the third wire (the contact plug 23b) wired to the source layer 15a is formed at the upper side of the main pillar 18, the third wire can be disposed at a position having small parasitic capacitance or the like.

The layers of the main pillar 18 are formed in a concentric shape with a focus on the central axis M', similarly to the semiconductor device 1 shown in FIG. 2A and FIG. 2B. It is preferable that the body layer 14a also has the same concentric shape as that of the source layer 15a and the drain layer 13a. It is preferable that the surface of the body layer 5 is parallel to the p-n junction boundary between the back gate electrode 6 and the body layer 5. It is preferable that the layers of the main pillar 18 have a constant width in their transverse sections and have a constant height in their longitudinal sections. Moreover, it is preferable that the gate insulating film 19 covering the body layer 14a also has a constant film thickness. Further, it is preferable that the front gate electrode 20 covering the gate insulating film 19 is arranged to have the same height position and the same vertical length as those of the body layer 14a and is formed to have the same film thickness. In addition, although the above described embodiment is described using a cylindrical transistor, an SGTJ transistor of the present invention is not limited to this shape. For example, as shown in FIG. 8 and FIG. 9, the SGTJ transistor can have a multi-angular pillar such as a square pillar or a triangle pillar of which the cross-sectional shape is a concentric quadrangle or triangular shape. However, it is preferable to have a constant width in the transverse section of the main pillar surrounded by the front gate electrode and have a constant height in a longitudinal section thereof. Furthermore, it is preferable that the gate insulating film also has a constant film thickness.

Moreover, in regard to a conduction type, the source layer 15a, the drain layer 13a, and the body layer 14a may be formed of p-type material, and the back gate electrode 17 may be formed of n-type material. Further, in regard to the gate electrode, a plurality of gate electrodes may be provided in a direction perpendicular to the surface of the main pillar 18, and capacitance may be provided in the source layers 15a between the gate electrodes. In this way, it is possible to realize a multivalued DRAM which uses the plurality of gate electrodes from only the drain layer 13a. Moreover, the gate insulating film 19 may be formed on the inner surface of the main pillar 18, the front gate electrode 20 may be further formed on inside thereof, and the back gate electrode 17 may be formed on the outer surface of the main pillar 18, so as to have a reverse function of the gate electrode.

As described above, according to the semiconductor device 11 of the embodiment of the present invention, it is possible to realize a characteristic equal to that of the SOI transistor at low cost without using an expensive SOI wafer and realize a transistor which can perform the reduction of parasitic capacitance, the prevention of latch-up, the reduction of junction leakage, and the suppression of short channel effect.

According to the semiconductor device 11, since the SOI substrate is not used, it is possible to solve a problem of the self-heating effect owing to the large difference between heat conductivities of the embedded oxide film and the silicon layer. The semiconductor device 11 becomes a vertical metal oxide semiconductor structure using a conventional substrate which can effectively release heat generated by the transistor similarly to the conventional substrate. In addition to this, when the semiconductor device is applied to a memory cell of DRAM, junction leakage currents can be reduced and refresh frequency per time can be reduced.

Moreover, the semiconductor device becomes a transistor structure of a planar-type transistor when the vertical metal oxide semiconductor has a height similar to the height of the conventional planar-type gate. Short channel effect can be restrained like the Fin FET and SGT by surrounding the whole channel region with the gate. A transistor with an extremely short channel can be manufactured by doping during the crystal growth in comparison with the manufacture by ion implantation. Moreover, the design of a transistor becomes easy because the derivation of a depletion layer width of a p-n junction in a design can be also computed by step-type approximation.

[Example of Manufacturing Method of Semiconductor Device]

Next, it will be explained about a manufacturing method of the semiconductor device 11 shown in FIG. 3 with reference to FIG. 4A to FIG. 7B. This manufacturing method includes a process of sequentially forming a first semiconductor film, a second semiconductor film, and a third semiconductor film, which become each layer in the main pillar, on the substrate; a process of forming the back gate electrode; a process of forming the main pillar by etching; a process of forming the gate insulating film; and a process of forming the front gate electrode.

Figure 4A:
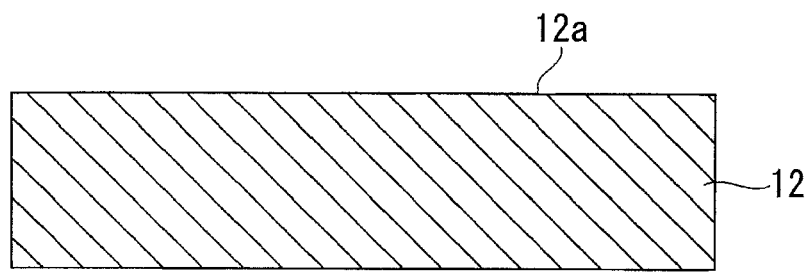
FIG. 4A is a cross-sectional view explaining a method for manufacturing the semiconductor device according to the embodiment of the present invention.
Figure 4B:
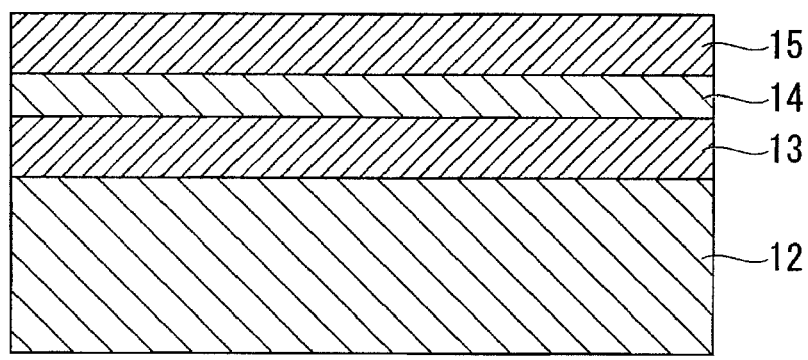
FIG. 4B is a cross-sectional view explaining a method for manufacturing the semiconductor device according to the embodiment of the present invention.

First, in the process of forming the first to the third semiconductor films, the single crystal silicon substrate 12 is prepared as shown in FIG. 4A, for example. Then, the surface 12a of the substrate is cleaned in a surface cleaning manner (APM cleaning+SPM cleaning). After removing a natural oxide film and particles attached to the substrate surface 12a from the start, a natural oxide film is formed on the surface 12a of the substrate. Next, as shown in FIG. 4B, the first semiconductor film 13, the second semiconductor film 14, and the third semiconductor film 15 are sequentially stacked. In a process of forming the first to the third semiconductor films 13 to 15, a silicon film is formed and at the same time an impurity which is a dopant element is introduced.

As set forth, in order to remove the natural oxide film of the surface 12a of the substrate, the substrate is heated to 1200 degrees Celsius or more within a vacuum chamber so as to expose an atomic silicon surface. Next, the semiconductor substrate 12 is heated to around 1100 degrees Celsius that are crystal growth temperature of silicon. Then, single crystal silicon is grown by a chemical vapor deposition (CVD) method or the like, using $SiH_4$, $SiH_2Cl_2$, $SiHCl_3$, $SiCl_4$, and so on as precursor gases. N-type impurities such as $PH_3$, $AsH_3$, and so on are introduced so that doping concentration becomes from $1\times10^{15}$ to $1\times10^{22}$ cm$^{-3}$. The n$^+$-type first semiconductor film 13 is formed, and then the n-type second semiconductor film 14 and the n$^+$-type third semiconductor film 15 are sequentially stacked, where the n$^+$-type means high-density n-type.

Total thickness of the first to the third semiconductor films 13 to 15 should be as thick as needed. For example, it is preferable that the total thickness is around 50 nm. According to this, since the distance between the drain region or the source region and the gate electrode is separated, the parasitic capacitance becomes small.

Moreover, a molecular beam epitaxy (MBE) method or the like using a solid-state silicon source may be used in place of a CVD method. Even in this case, P and As, or B, and the like are used as p-type or n-type impurities similarly to the above. In order to remove the native oxide film, an etching in a multi-chamber or the like except a heating chamber may be used.

In this manner, the doping method during the crystal growth can directly control the type of dopant and the doping concentration unlike the conventional ion implantation. For this reason, since the type of dopant can be instantly changed and the precise gradient of doping concentration can be freely set dynamically and continuously, design and manufacture thereof are easy. The LDD, the pocket, and the body layer forming a channel can be designed by applying this characteristic. An LDD layer reduces the doping concentration compared to the drain layer and the source layer, and is formed directly over the drain (source) layer and directly under the source (drain) layer. Moreover, it is possible to continuously manufacture the LDD layer from the source layer and the drain layer. For this reason, when manufacturing the pocket layer and the body layer forming the channel, the manufacture can be performed by changing the type of dopant or by changing concentration.

As described above, the derivation of a depletion layer width of a p-n junction in a design can be also computed by step-type approximation. For this reason, it is possible to improve a trial manufacturing cost, a design efficiency, and a yield. A vertical transistor in which doping is performed during the crystal growth is the most suitable for design and manufacture of a mass-production type and ultrashort channel type transistor.

Figure 4C:
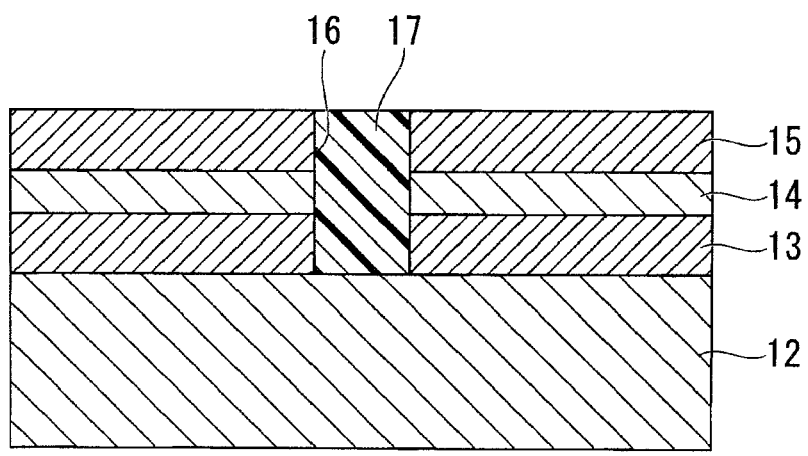
FIG. 4C is a cross-sectional view explaining a method for manufacturing the semiconductor device according to the embodiment of the present invention.

Next, in the process of forming the back gate electrode, central axis portions of the first to the third semiconductor films 13 to 15 are removed as shown in FIG. 4C. The pillar-shaped hole 16 penetrating from the upper portion of the third semiconductor film 15 to the lower portion of the first semiconductor film 13 is formed. Crystal growth of p-type silicon or deposition of p-type poly-silicon is performed in the hole 16. Then, the back gate electrode 17 is formed. As set forth, at first, after coating a resist on the third semiconductor film 15, exposure is performed using a reticle. Then, a resist pattern is formed on the third semiconductor film 15. After that, anisotropic dry etching is performed along this resist pattern. From the top, the third semiconductor film 15 corresponding to the first layer and the second semiconductor film 14 corresponding to the second layer are removed, and the first semiconductor film 13 corresponding to the third layer is further removed, so as to form the hole 16.

Alternatively, an oxide film that acts as a hard mask is formed on a top face of the third semiconductor film 15 as is thicker than the native oxide film, by annealing the third semiconductor film 15. Next, after coating the resist, exposure is performed using the reticle. Then, the resist pattern is formed on the hard mask layer. After that, the hard mask is formed by dry etching along this resist pattern. Finally, anisotropic wet etching is performed in tetra-methyl-ammonium-hydroxide (TMAH) that is an alkali solution. The third semiconductor film 15 corresponding to the first layer and the second semiconductor film 14 corresponding to the second layer are removed, and the first semiconductor film 13 corresponding to the third layer is further removed, so as to form the hole 16.

Then, in order to form the back gate electrode 17, crystal growth of p-type silicon or deposition of p-type poly-silicon is performed in the hole 16. P-type silicon crystal (or p-type poly-silicon) is grown until it becomes thicker than the third semiconductor film 15, and then the surface of p-type silicon crystal (or p-type poly-silicon) is planed by chemical mechanical polishing (CMP). Furthermore, p-type silicon crystal (or p-type poly-silicon) is etched back until it becomes slightly thinner than the third semiconductor film 15.

In this way, a reverse bias can be applied by forming the p-type back gate electrode 17. The semiconductor device of the present invention can function like a back gate of a conventional double gate by changing the threshold voltage without flowing electric currents even when a voltage is applied to body layer. For this reason, it is possible to decrease leakage currents when turning off the transistor by dynamically raising or lowering the threshold voltage. However, it is necessary that the first to the third semiconductor films 13 to 15 that become the drain layer, the body layer, the source layer of this transistor are formed of an n-type semiconductor. The reason is that the transistor becomes a bipolar transistor when the body layer is a p-type and thus electric currents flow from the back gate electrode to the body layer.

Moreover, since the back gate electrode 17 is formed in a pillar shape penetrating from the upper portion to the lower portion on the inner side of the main pillar 18, a gate oxide film does not have to be provided on the inner side. For this reason, it is possible to make a precision of a manufacturing process easy. In general, the inside and outside gate oxide films must have the same oxide film thickness, in order to simultaneously operate internal and external gates. However, oxide films such as a thermal oxide film cannot realistically have the same oxide film thickness because of the reason of thermal radiation. For this reason, it is preferable that the inside gate has a structure which does not depend on a film thickness of the oxide film. Here, when the inside reverse bias junction gate dynamically changes the threshold voltage and the outside gate operates like the gate of the conventional transistor in a state that the inside and outside gates have different gate structures, a high speed and low power consumption transistor can be realized as improved SGT. As described above, in the vertical transistor structure, it is preferable to form an inside gate structure that has a width in a process margin and can make a process precision easy.

Figure 5A:
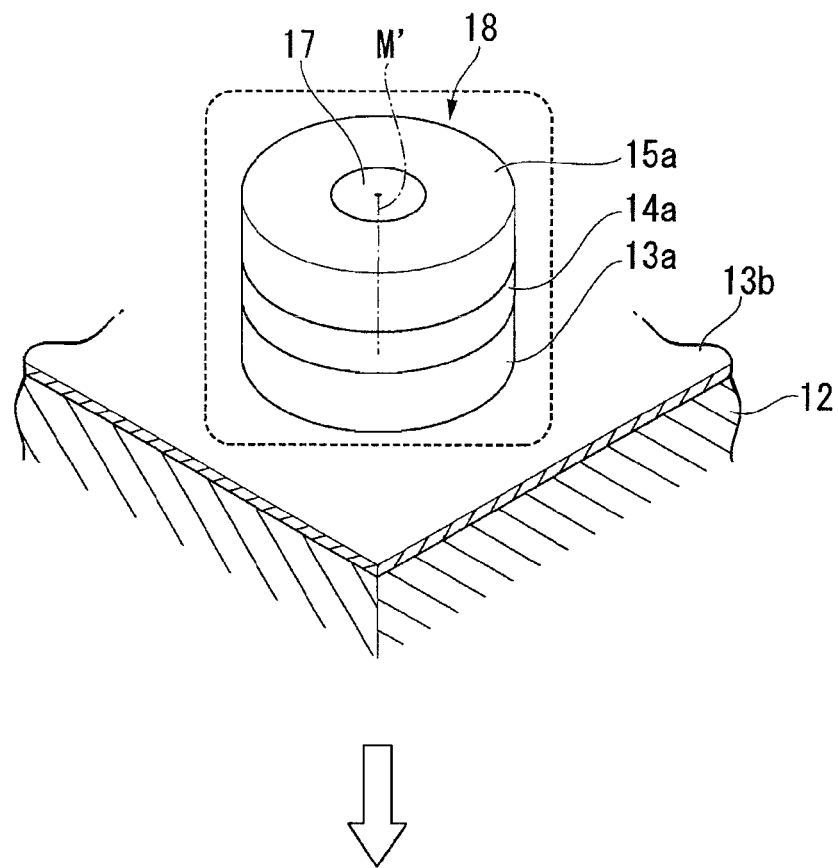
FIG. 5A is a cross-sectional view explaining a method for manufacturing the semiconductor device according to the embodiment of the present invention.
Figure 5B:
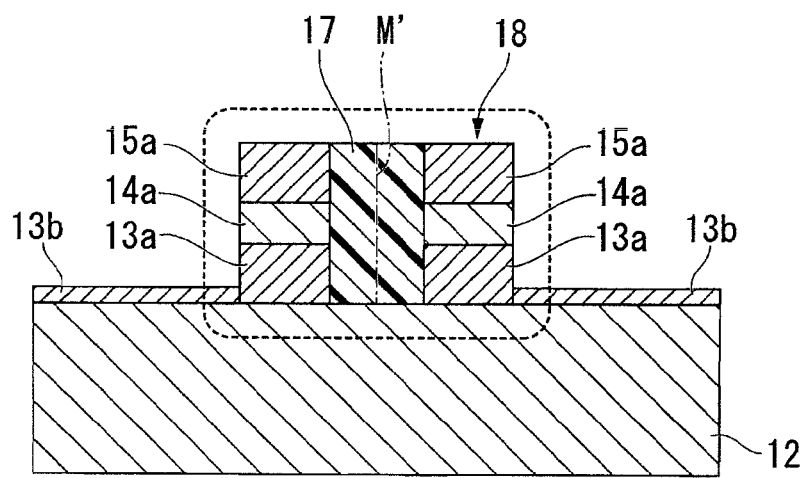
FIG. 5B is a cross-sectional view explaining a method for manufacturing the semiconductor device according to the embodiment of the present invention.

Subsequently, in the process of forming the main pillar by etching, the third semiconductor film 15, the second semiconductor film 14, and a part of the first semiconductor film 13 are patterned to form the first to the third semiconductor films 13 to 15 in a shape of which a cross section is substantially convex, as shown in FIG. 5A and FIG. 5B. The cylindrical main pillar 18 is formed by shaping the films in a concentric shape with a focus on the central axis M when seeing the substrate surface 12a of the substrate 12 from above.

As set forth, at first, after coating the resist on the third semiconductor film 15, the exposure is performed using the reticle. Then, the resist pattern is formed on the third semiconductor film 15. After that, anisotropic dry etching is performed along this resist pattern. From the top, the third semiconductor film 15 corresponding to the first layer and the second semiconductor film 14 corresponding to the second layer are removed, and the first semiconductor film 13 corresponding to the third layer is further removed while leaving it at about 10 nm.

Alternatively, the oxide film that acts as the hard mask is formed on the top face of the third semiconductor film 15 as is thicker than a native oxide film, by annealing the third semiconductor film 15. Next, after coating the resist, the exposure is performed using the reticle. Then, the resist pattern is formed on the hard mask layer. After that, the hard mask is formed by dry etching along the resist pattern. Finally, anisotropic wet etching is performed in TMAH or the like that is an alkali solution. The third semiconductor film 15 corresponding to the first layer and the second semiconductor film 14 corresponding to the second layer are removed, and the first semiconductor film 13 corresponding to the third layer is further removed while leaving it at about 10 nm.

Here, from the top, a remaining portion of the third semiconductor film 15 corresponding to the first layer becomes the source layer (the upper portion of the source and drain diffused layers) 15a, and a remaining portion of the second semiconductor film 14 becomes the body layer 14a. Moreover, a concentric-shape portion in contact with the body layer 14a in a remaining portion of the first semiconductor film 13 becomes the drain layer (the lower portion of the source and drain diffused layers) 13a, so as to form the cylindrical main pillar 18.

In this manner, since the cylindrical main pillar 18 is formed, it is possible to realize a vertical metal oxide semiconductor transistor having a long channel width that can increase an outside diameter while holding a threshold voltage constant and can improve ON currents. In a conventional SGT structure, doping concentration of a source, a drain, LDD, pocket, and a body layer had to be set so that the threshold value was not changed even if the channel length was changed. However, since the thickness of a silicon layer also has influence on a threshold value in case of the vertical MOS, the thickness of a silicon layer must be held constant in order not to largely change the threshold value irrespective of the change of the thickness of silicon layer. For this reason, it is preferable that the silicon layer forming the channel is a cylinder type and has a concentric cross section. On the contrary, an arbitrary threshold voltage in the same channel length can be realized by freely changing the thickness of a silicon layer. For this purpose, although a conventional ion implantation method requires a plurality of ion implantation processes, it can be realized by a single etching manufacturing process in the semiconductor device of the present invention.

Moreover, the main pillar 18 has a constant width in a transverse section thereof and a constant height in a longitudinal section thereof. In this way, it is possible to hold the thickness of a silicon layer constant with a low-concentration doping and hold a threshold voltage constant. Further, since the outside diameter of the main pillar 18 can be increased while holding the thickness of a silicon layer constant, ON currents can be improved.

Moreover, since the body layer 14a has the same concentric shape as that of the source layer 15a and the drain layer 13a, a region (the body layer 14a) in which the channel is formed becomes a concentric doughnut-shape. It is possible to enlarge the gate width of the transistor without enlarging an outline dimension and to increase ON currents.

Moreover, the layers (the source layer 15a, the body layer 14a, and the drain layer 13a) of the main pillar 18 are concentrically formed with a focus on the central axis M'. In doing so, it is possible to realize a structure by which a transistor becomes a shape suitable for relaxation of electric fields and has a channel width capable of being easily increased. Compared to the SGT structure, this structure can increase the outside diameter of the silicon cylinder, that is to say, the channel can be increased width with keeping the threshold voltage being constant when the thickness of silicon layer and the doping concentration are constant. Therefore, ON currents can be improved. When the silicon layer forming the channel is formed in a concentric doughnut-shaped silicon cylinder with long channel width, increase efficiency of ON currents per unit wafer area is higher than that of ON currents of SGT. A conventional SGT structure had a complicated design in order to hold the same threshold voltage even if the silicon layer thickness and the channel width were changed. For this reason, in order to obtain high ON currents per unit wafer area while holding a good transistor characteristic, it is necessary to have a concentric doughnut-shaped structure with the long channel width like the semiconductor device of the present invention. Furthermore, high ON currents can be realized in the vertical metal oxide semiconductor transistor. As a result, this results in a transistor structure suitable for a memory cell such as a phase change memory (PRAM) that requires large ON currents.

Figure 6A:
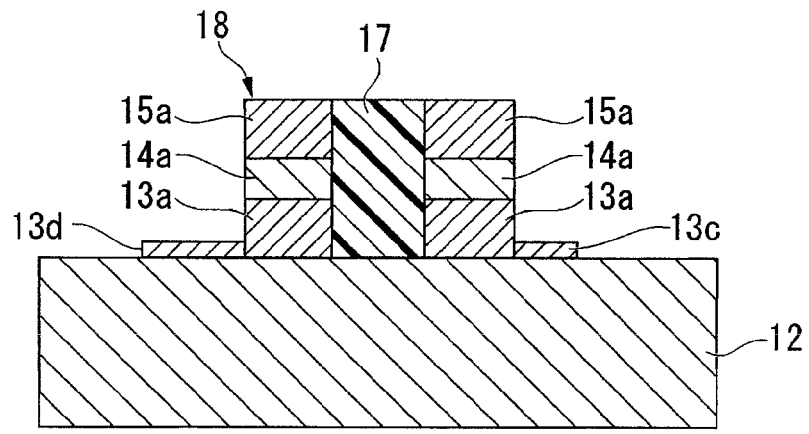
FIG. 6A is a cross-sectional view explaining a method for manufacturing the semiconductor device according to the embodiment of the present invention.

Subsequently, the drawn electrode portion is formed from an about 10 nm thin film 13b at the side of the substrate 12 in the remaining portion of the first semiconductor film 13. The thin film 13b is etched as shown in FIG. 6A. The drawn electrode portions 13c and 13d are formed to protrude from the lower portion of the drain layer 13a to an outer circumferential direction, and an electrode is shaped in the drawn structure. In this manner, since the lower portion and the upper portion of the drain layer 13a are sufficiently separated, parasitic capacitance of the drain layer 13a and the gate can be largely reduced. At the same time, electrodes and wires can be easily positioned.

In this manner, since the drawn electrode portions 13c and 13d are formed, the drain layer 13a can be formed to have a structure that largely protrudes in a transverse direction in comparison with the body layer 14a and the source layer 15a. Therefore, a poly-silicon wire can be easily performed. At this time, the front gate electrode made from poly-silicon can be formed on a silicon oxide insulating layer that functions as an etching stop layer. From an influence of parasitic capacitance or the like, the width of the gate electrode parallel to the substrate 12 is also the factor which is important to performance improvement. For this reason, it is important to largely separate the source layer 15a and the drain layer 13a protruding from the body layer 14a from the front gate electrode. In this manner, since the drawn electrode portions 13c and 13d are provided, the drain layer 13a can be lengthened in a direction perpendicular to the substrate 12 and thus be largely separated from the front gate electrode.

Figure 6B:
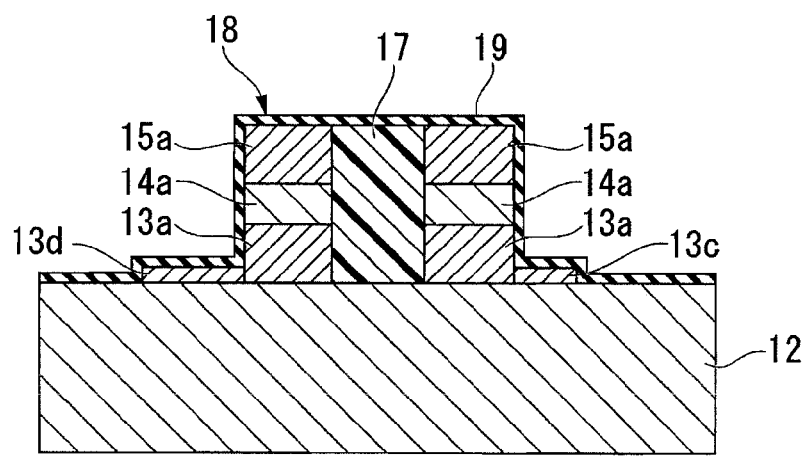
FIG. 6B is a cross-sectional view explaining a method for manufacturing the semiconductor device according to the embodiment of the present invention.

Next, in the process of forming the gate insulating film, the gate insulating film is formed on the outer surface of the main pillar 18 so as to at least cover the body layer 14a. As set forth, as shown in FIG. 6B, an oxide film with about 1 to 10 nm thickness is deposited on the main pillar 18 and the drawn electrode portions 13c and 13d, by such as a CVD method or an annealing method in an oxidation atmosphere. The annealing method in an oxidation atmosphere dry-oxidizes the surfaces of the main pillar 18 and the drawn electrode portions 13c and 13d in an oxidation furnace, in order to form the gate insulating film 19 made from silicon oxide film. In the CVD method, a high-k film such as $HfO_2$ of high dielectric materials and insulating materials such as $SiO_2$ are deposited using raw gas such as tetra-ethoxy-silane (TEOS).

Figure 6C:
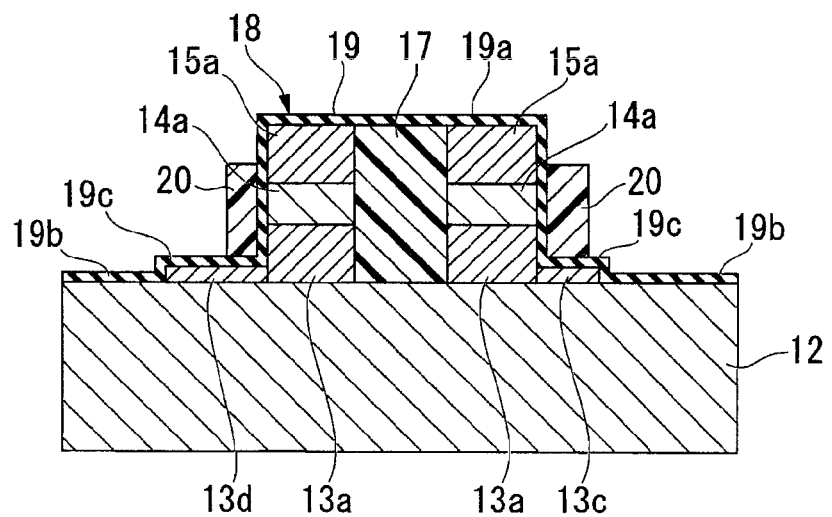
FIG. 6C is a cross-sectional view explaining a method for manufacturing the semiconductor device according to the embodiment of the present invention.

Next, in the process of forming the front gate electrode, the front gate electrode is formed to cover the body layer 14a while placing the gate insulating film 19 therebetween. As set forth, a poly-silicon layer is firstly formed to cover the gate insulating film 19 by the CVD method. Then, after planing unevenness of the top face of the poly-silicon layer by CMP, the poly-silicon layer is etched back until the gate insulating film 19a formed on the top face of the main pillar 18 in the gate insulating film 19 is exposed, as shown in FIG. 6C. Furthermore, the poly-silicon layer is removed by etching so that outside portions of the gate insulating film 19b in contact with the surface 12a of the substrate and the gate insulating film 19c formed on the drawn electrode portions 13c and 13d are exposed, in order to form the front gate electrode 20 made from the remaining portion of the poly-silicon layer.

Figure 7A:
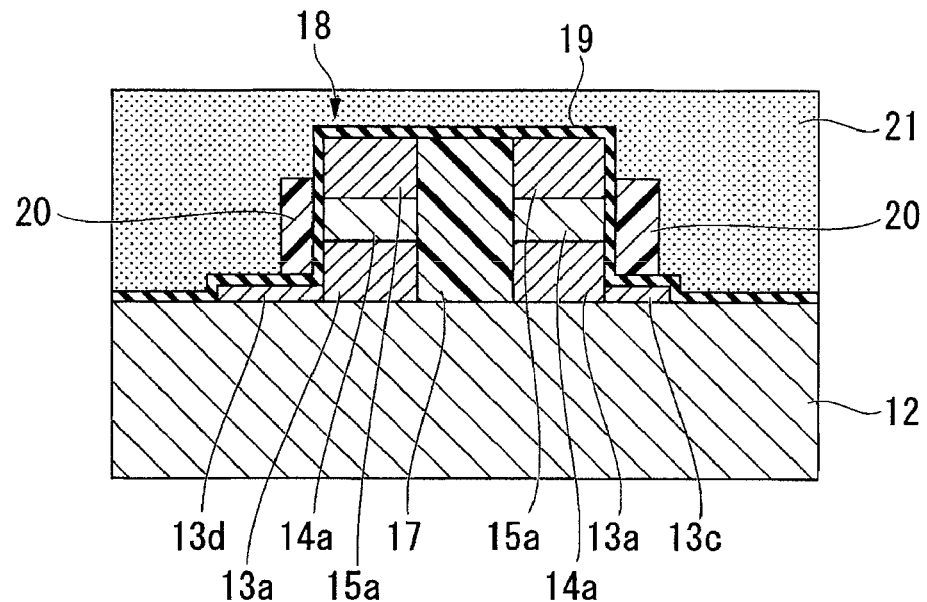
FIG. 7A is a cross-sectional view explaining a method for manufacturing the semiconductor device according to the embodiment of the present invention.

Subsequently, an interlayer insulation layer 21 made from a 25 to 40 nm or more oxide film is formed by the CVD method or the like, as shown in FIG. 7A. As set forth, the oxide film is deposited on the entire surface of the substrate 12 by the CVD method which uses a gas source of silicon oxide such as TEOS. Alternatively, a film may be formed by a method such as spin on glass (SOG) using low-dielectric low-k materials. This oxide film functions as an interlayer insulation film between an individual device and a wire. In order to reduce an etching irregularity of the following process, unevenness of the top face of the interlayer insulation film 21 is removed and planed by CMP.

Figure 7B:
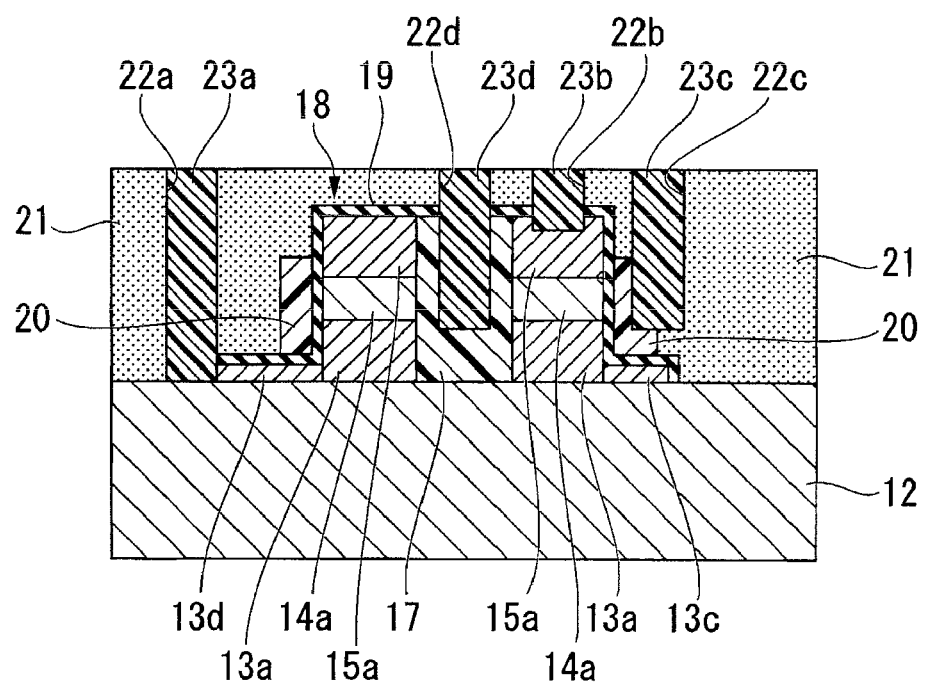
FIG. 7B is a cross-sectional view drawing explaining a method for manufacturing the semiconductor device according to the embodiment of the present invention.

Next, as shown in FIG. 7B, the interlayer insulation film 21 is etched and the contact hole 22a connected to the drain layer 13a is formed at the outer side of the drawn electrode portion 13d. The contact hole 22b connected to the source layer 15a is formed on the upper portion of the source layer 15a, and the contact hole 22c connected to the front gate electrode 20 is symmetrically formed at the side opposite to the contact hole 22a so as to contact in a lateral face of the front gate electrode 20. The contact hole 22d connected to the back gate electrode 17 is formed on the upper portion of the back gate electrode 17. Next, by the CVD method, the contact holes 22a, 22b, 22c, and 22d include therein poly-silicon that is amorphous silicon doped with p-type or n-type impurities (P, As and B), and the contact plugs 23a, 23b, 23c, and 23d are respectively formed in the contact holes. The contact holes 22a, 22b, 22c, and 22d may include therein tungsten (W) instead of the poly-silicon, and the contact plugs 23a, 23b, 23c, and 23d may be respectively formed in the contact holes. In addition, wires are respectively connected to the contact plugs 23a, 23b, 23c, and 23d. Since the first wire (the contact plug 23c) wired to the front gate electrode 20 and the second wire (the contact plug 23a) wired to the drawn electrode portion 13d are symmetrically arranged at the outer side of the main pillar 18, parasitic capacitance can be reduced. Moreover, since the third wire (the contact plug 23b) wired to the source layer 15a is formed at the upper side of the main pillar 18, the third wire can be disposed at a position having small parasitic capacitance or the like. As described above, it is possible to manufacture the semiconductor device 11 shown in FIG. 3.

In addition, although the above-described embodiment was described using a cylindrical transistor, the SGTJ transistor of the present invention is not limited to this shape. For example, as shown in FIG. 8 and FIG. 9, the SGTJ transistor can have a multi-angular pillar such as a square pillar or a triangle pillar of which the cross-sectional shape is a concentric quadrangle or triangular shape. However, it is preferable to have constant width in the transverse section of the main pillar surrounded by the front gate electrode and have a constant height in its longitudinal section. Furthermore, it is preferable that the film thickness of the gate insulating film is also constant.

Moreover, in regard to conductivity type, the first to third semiconductor films 13 to 15 may be formed of p-type material, and the back gate electrode 17 may be formed of n-type material. Further, in regard to the gate electrode, a plurality of gate electrodes may be provided in a direction perpendicular to the outer surface of the main pillar 18, and capacitance may be provided in the source layers 15a between the gate electrodes. In this way, it is possible to realize a multivalued DRAM which uses the plurality of gate electrodes from only the drain layer 13a. Moreover, the gate insulating film 19 may be formed on the inner surface of the main pillar 18, the front gate electrode 20 may be further formed on its inside, and the back gate electrode 17 may be formed on the outer surface of the main pillar 18, so as to have a reverse function of the gate electrode.

According to the manufacturing method of the semiconductor device 11 as described above, it is possible to realize a characteristic equal to that of the SOI transistor at low cost without using an expensive SOI wafer and realize a transistor which can perform reduction of parasitic capacitance, prevention of latch-up, reduction of junction leakage, and suppression of short channel effect. Furthermore, since the SOI substrate is not used, it is possible to cancel a problem of a self-heating effect owing to the large difference between heat conductivity of the embedded oxide film and heat conductivity of the silicon layer. The semiconductor device 11 becomes a vertical MOS structure using a conventional substrate which can effectively release heat generated by the transistor similarly to the conventional substrate. In addition to this, when the semiconductor device is applied to a memory cell of DRAM, junction leakage currents can be reduced and refresh frequency per time can be reduced. Moreover, the semiconductor device becomes a planar-type transistor when the vertical MOS has a height similar to the height of the conventional planar-type gate. Short channel effect can be restrained like Fin FET and SGT by surrounding the whole channel region with the gate. A transistor with an extremely short channel can be manufactured by dopant implantation in crystal growth in comparison with the manufacture by ion implantation. Moreover, a design of a transistor becomes easy because the derivation of a depletion layer width of a p-n junction in a design can be also computed by step-type approximation.

Embodiment

Next, it will be explained about an embodiment of the present invention in detail. The semiconductor device (STGJ) 11 having the structure shown in FIG. 3 was manufactured according to the processes shown in FIG. 4A to FIG. 7B.

Figure 10:
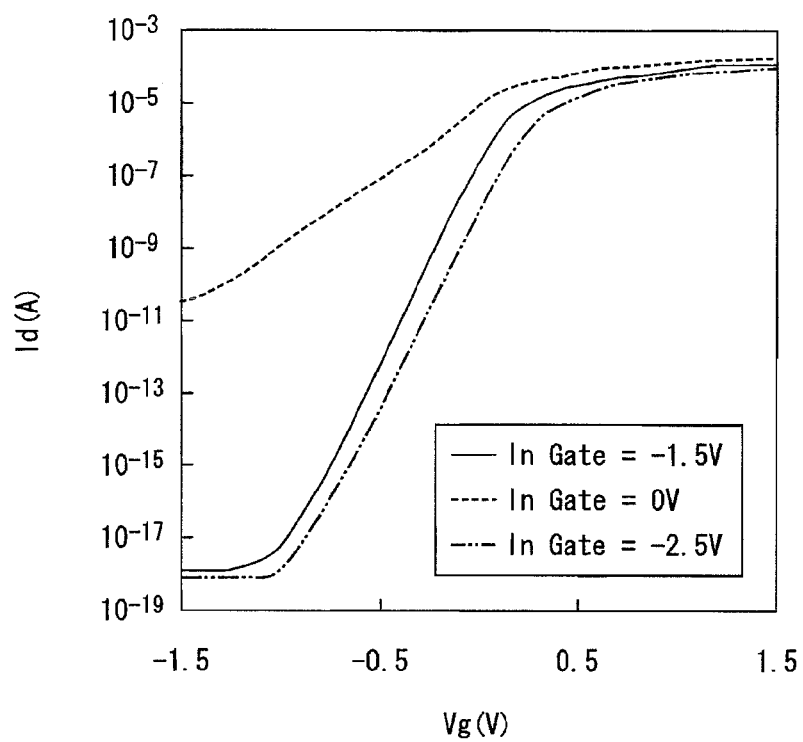
FIG. 10 is a graph showing relation between voltages between a back gate and a drain and electric currents between the drain and a source when changing an inside gate voltage of the semiconductor device according to the embodiment of the present invention.
Figure 11:
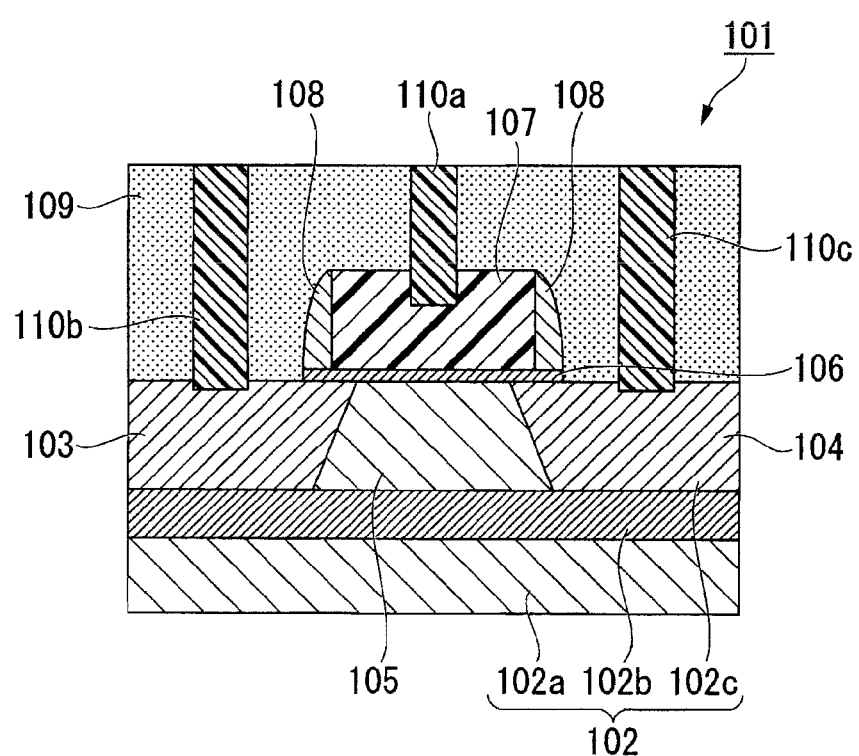
FIG. 11 is a cross-sectional schematic view showing a conventional semiconductor device.
Figure 12:
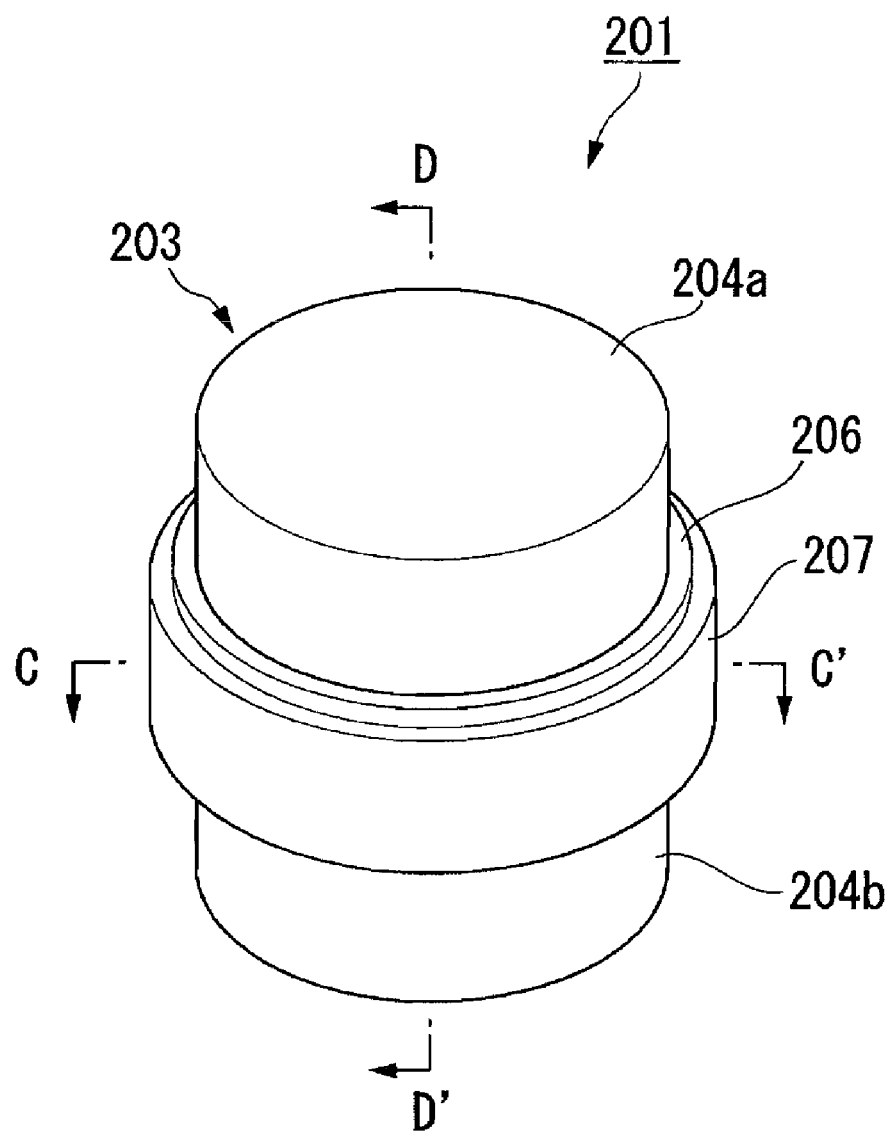
FIG. 12 is a perspective view showing the conventional semiconductor device.
Figure 13A:
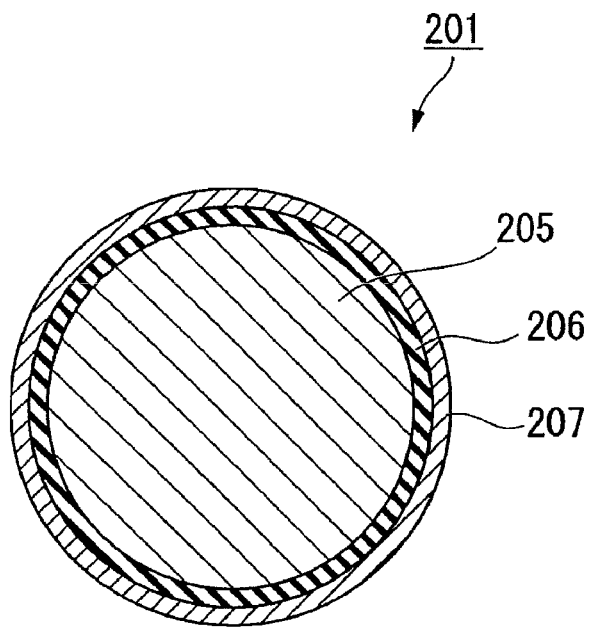
FIG. 13A is a cross-sectional view showing the conventional semiconductor device, taken along a C-C' line shown in FIG. 12.
Figure 13B:
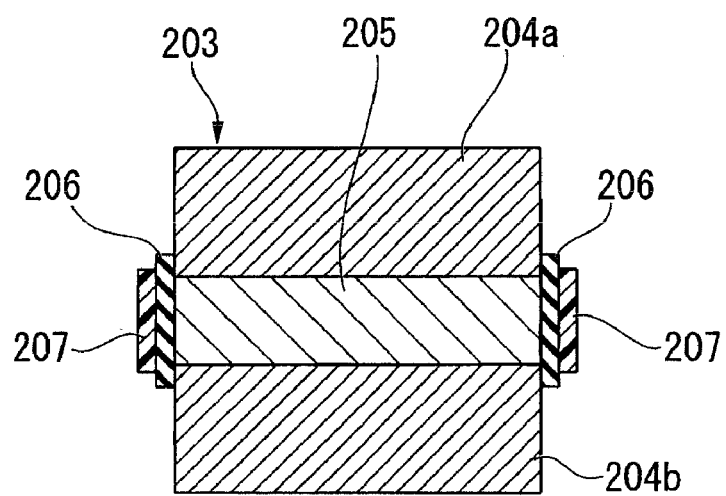
FIG. 13B is a cross-sectional view showing the conventional semiconductor device, taken along a D-D' line shown in FIG. 12.

FIG. 10 shows an electrical characteristic of the semiconductor device (STGJ) 11. The transistor has a gate length of 45 nm, a gate width of 220 nm, a thickness of the silicon layer of 20 nm, a gate insulating film of 5 nm, a carrier density of $3\times10^{18}$ cm$^{-3}$ of the body region forming the channel, a source and drain concentration of $2\times10^{20}$ cm$^{-3}$, the reverse bias gate electrode of $1\times10$ cm$^{-3}$. A vertical axis is electric currents between a drain and a source, and a unit is a logarithmic expression expressed by ampere A. A horizontal axis is a voltage between a front gate and a source, and a unit is a linear expression expressed by voltage V. The voltage of the back gate is changed like −1.5V, −2.5V, 0V.

From a result shown in FIG. 10, it is found that leakage currents when the voltage between the front gate and the source is 0V are decreased, when a voltage is applied to the back gate in a backward direction of a p-n junction. Therefore, it is found to decrease leakage currents when turning off a transistor, according to this structure.

As the first application, the semiconductor device of the present invention can be applied to integrated circuits that requires large ON currents, such as a power device, phase change random access memory (PRAM) and DRAM. Moreover, as the second application, the semiconductor device of the present invention can be applied to ultrashort-channel very-high-speed integrated circuits such as a super computer or CPU operating at 10 to 100 GHz. Furthermore, as the third application, the semiconductor device of the present invention can be applied to integrated circuits that have the same characteristic as that on the SOI wafer excellent to thermal release characteristics like a conventional bulk substrate which can respond to a cruel condition, such as an integrated circuit for automotive engine control or an integrated circuit for universe satellite. Moreover, as the fourth application, the semiconductor device of the present invention can be preferably applied to a low-cost transistor that has the same characteristic as that on the SOI wafer, in spite of not using a SOI wafer, an integrated circuit which utilizes sources for partial depletion type and complete depletion type transistors that have the same characteristic as that on the SOI wafer, a floating-body-type transistor which is used in memory cells of a capacitorless DRAM, and so on. In addition, as the fifth application, the semiconductor device of the present invention can be applied to reduction techniques of die square measure by three-dimension high integration, such as LSI (ASIC), CPU, DSP for a low-cost specification application that is determined by die square measure.

According to the above, it is possible to realize a characteristic equal to that of the SOI transistor at low cost without using an expensive SOI wafer and realize a transistor which can perform the reduction of parasitic capacitance, the prevention of latch-up, the reduction of junction leakage, and the suppression of short channel effect. Since the SOI substrate is not used, it is possible to solve a problem of the self-heating effect owing to the large difference between heat conductivity of the embedded oxide film and heat conductivity of the silicon layer. The semiconductor device becomes a vertical MOS structure using a conventional substrate which can effectively release heat generated by the transistor similarly to the conventional substrate. In addition to this, when the semiconductor device is applied to a memory cell of DRAM, junction leakage currents can be reduced and refresh frequency per time can be reduced. Moreover, the semiconductor device becomes a transistor structure on behalf of a planar-type transistor when the vertical MOS has a height similar to the width of the conventional planar-type gate. Short channel effect can be restrained like Fin FET and SGT by surrounding the whole channel region with the gate. A transistor with an extremely short channel can be manufactured by dopant implantation in crystal growth in comparison with the manufacture by ion implantation. Moreover, a design of a transistor becomes easy because the derivation of a depletion layer width of a p-n junction in a design can be also computed by step-type approximation.

According to the above, it is possible to realize a vertical MOS transistor with a long channel width in which ON currents can be improved. A conventional SGT structure must set doping concentration of the source, the drain, the LDD, the pocket, and the body layer so that the threshold value is not changed in spite of the change of channel length. However, in the vertical MOS structure, since the thickness of a silicon layer is also related to the threshold value, the thickness of silicon layer must be held in order not to largely change the threshold value in spite of the change of the thickness of the silicon layer. For this reason, it is preferable to have a structure that the silicon layer forming the channel has a cylindrical shape and a concentric cross section. On the contrary, an arbitrary threshold voltage in the same channel length can be realized by freely changing the thickness of the silicon layer. For this purpose, although the conventional ion implantation method requires a plurality of ion implantation processes, it can be realized by a single etching manufacturing process in the semiconductor device.

Moreover, according to the semiconductor device of the embodiment, the central axis of the main pillar may be perpendicular to a surface of the substrate, and the source and drain diffused layers have a concentric shape centered on the central axis. In this way, since the thickness of the silicon layer is changed without changing the height of the main pillar, it is possible to realize a vertical MOS transistor structure with a stable width.

Moreover, according to the semiconductor device, the body layer has the same concentric shape as that of the source and drain diffused layers, and thus the region in which a channel is formed becomes a concentric shape. Further, it is possible to enlarge the gate width of the transistor without enlarging an outline dimension and thus increase on-state currents.

Moreover, according to the semiconductor device, the main pillar has a constant width in a transverse section thereof and has a constant height in a longitudinal section thereof. In this way, it is possible to hold the thickness of a silicon layer constant with a low-concentration doping and hold the threshold voltage constant. Furthermore, since the outside diameter of the main pillar is increased while holding the thickness of a silicon layer constant, ON currents can be improved.

Moreover, according to the semiconductor device, the concentric shape in each layer of the main pillar is a circle centered on the central axis. In doing so, it is possible to realize a structure by which a transistor becomes a shape suitable for relaxation of electric fields and has a channel width capable of being easily increased. Compared to the SGT structure, this structure can increase the outside diameter of the silicon cylinder, that is to say, channel width while holding the threshold voltage constant when the thickness of a silicon layer is constant in a state that dopant concentration is constant. Therefore, ON currents can be improved. When the silicon layer forming the channel is formed in a concentric doughnut-shaped silicon cylinder with a long channel width, an increase efficiency of ON currents per unit wafer area is higher than that of ON currents of SGT. The conventional SGT structure has a complicated design in order to hold the same threshold voltage even if the silicon layer thickness and the channel width are changed. For this reason, in order to obtain high ON currents per unit wafer area while holding a good transistor characteristic, it is necessary to have a concentric doughnut-shaped structure with long channel width like the semiconductor device of the present invention. Furthermore, high ON currents can be realized in the vertical MOS transistor. As a result, this results in a transistor structure suitable for a memory cell such as a PRAM that requires large ON currents.

Moreover, the semiconductor device includes a back gate electrode that is formed inside the main pillar, is connected with the source and drain diffused layers and the body layer in a p-n junction manner, and made from the second-conduction-type material. In this way, since the reverse bias can be added through the back gate electrode made from the second-conduction-type material, the semiconductor device can function like a back gate of a conventional double gate by changing the threshold voltage without flowing electric currents even when a voltage is applied to body layer. For this reason, it is possible to decrease leakage currents when turning off the transistor by dynamically raising or lowering the threshold voltage. However, it is necessary for the source and drain diffused layers and the body layer of this transistor to be formed of the first-conduction-type semiconductor. The reason is that the transistor becomes a bipolar transistor when the body layer is the second-conduction-type different from the first-conduction-type and thus electric currents flow from the back gate electrode to the body layer.

Moreover, according to the semiconductor device, the front gate electrode is arranged at an outer side of the main pillar, and the back gate electrode is formed in a pillar shape penetrating from the upper portion to the lower portion at an inner side of the main pillar. Thus, it is not necessary to provide a gate oxide film inward. In this way, it is possible to make a precision of a manufacturing process easy. In general, the inside and outside gate oxide films must have the same oxide film thickness, in order to simultaneously operate internal and external gates. However, oxide films such as a thermal oxide film cannot realistically have the same oxide film thickness because of reason of thermal radiation. For this reason, it is preferable that the inside gate has a structure which does not depend on the film thickness of the oxide film. Here, the inside reverse bias junction gate dynamically changes a threshold voltage and the outside gate operates like the gate of the conventional transistor in a state that the inside and outside gates have different gate structure. In this way, a high speed and low power consumption transistor can be realized as improved SGT. As described above, in the vertical transistor structure, it is preferable to form an inside gate structure that has a width in a process margin and can mitigate process precision.

Moreover, the semiconductor device includes a drawn electrode portion that is drawn to the outer side than an outer circumferential face of the main pillar at a bottom of the lower portion of the source and drain diffused layers. In this way, the lower portion of the source and drain diffused layers can be formed to have a structure that largely protrudes in a transverse direction in comparison with the body layer and the upper portion of the source and drain diffused layers, and thus a poly-silicon wire can be easily performed. At this time, the front gate electrode made from poly-silicon can be formed on a silicon oxide insulating layer that functions as an etching stop layer. From an influence of parasitic capacitance or the like, since the width of the gate electrode parallel to the substrate is also the factor which is important to performance improvement, it is important to largely separate the source and drain diffused layers protruding from the body layer from the front gate electrode. In this manner, since the drawn electrode portion is provided, the lower portion of the source and drain diffused layers can be lengthened in a direction perpendicular to the substrate and thus be largely separated from the front gate electrode.

Moreover, according to the semiconductor device, since a first wire wired to the front gate electrode and a second wire wired to the drawn electrode portion are symmetrically arranged at the outer side of the main pillar, parasitic capacitance can be reduced.

Moreover, according to the semiconductor device, since a third wire wired to the upper portion of the source and drain diffused layers is arranged and formed at an upper side of the main pillar, the third wire can be arranged at a position having small parasitic capacitance.

Moreover, the semiconductor device includes a plurality of back gate electrodes that are respectively same as the back gate electrode and are provided in parallel in a direction perpendicular to the outer surface of the main pillar, and capacitances that are provided between the back gate electrodes at the upper portion of the source and drain diffused layers. In this way, it is possible to realize a multivalued DRAM which uses the plurality of gates from the single lower portion of the source and drain diffused layers.

Moreover, according to the method for manufacturing a semiconductor device, since the outside diameter is increased while holding the same threshold voltage, it is possible to realize a vertical MOS transistor with long channel width in which ON currents can be improved. As set forth, the conventional SGT structure must set the doping concentration of the source, the drain, the LDD, the pocket, and the body layer so that the threshold value is not changed in spite of the change of channel length. However, in the vertical MOS structure, since the thickness of a silicon layer is also related to the threshold value, the thickness of the silicon layer must be held constant in order not to largely change the threshold value in spite of the change of the thickness of the silicon layer. For this reason, it is preferable to have a structure that the silicon layer forming the channel has a cylindrical shape and a concentric cross section. On the other hand, an arbitrary threshold voltage in the same channel length can be realized by freely changing the thickness of silicon layer. For this purpose, although the conventional ion implantation method requires a plurality of ion implantation processes, it can be realized by a single etching manufacturing process in the semiconductor device.

Although the invention has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A semiconductor device comprising:
   a cylindrical main pillar that is formed on a substrate;
   source and drain diffused layers that are formed in a concentric shape at upper and lower portions of said main pillar and made from a first-conduction-type material;
   a body layer that is formed at an intermediate portion of said main pillar sandwiched between said source and drain diffused layers and made from said first-conduction-type material;
   a front gate electrode that is formed on a outer surface of said main pillar while placing a gate insulating film therebetween; and
   a back gate electrode that is formed inside said main pillar and comes in contact with said source and drain diffused layers and said body layer.

2. The semiconductor device as recited in claim 1, wherein a central axis of said main pillar is perpendicular to a surface of said substrate, and said source and drain diffused layers have a concentric shape centered on said central axis.

3. The semiconductor device as recited in claim 1, wherein said body layer has the same concentric shape as that of said source and drain diffused layers.

4. The semiconductor device as recited in claim 1, wherein said main pillar has a constant width in a transverse section thereof and has a constant height in a longitudinal section thereof.

5. The semiconductor device as recited in claim 1, wherein said gate insulating film has a constant film thickness.

6. The semiconductor device as recited in claim 1, wherein said concentric shape in said source and drain diffused layers or said concentric shape in said source and drain diffused layers and said body layer is a circle centered on said central axis.

7. The semiconductor device as recited in claim 1, wherein said back gate electrode is a second-conduction-type electrode, and said source and drain diffused layers and said body layer are connected with said back gate electrode in a p-n junction manner.

8. The semiconductor device as recited in claim 1, wherein
   said front gate electrode is arranged at an outer side of said main pillar, and
   said back gate electrode is formed in a pillar shape penetrating from said upper portion to said lower portion at an inner side of said main pillar.

9. The semiconductor device as recited in claim 1, wherein a surface of said body layer is parallel to a p-n junction boundary between said back gate electrode and said body layer.

10. The semiconductor device as recited in claim 1, wherein said front gate electrode is formed with a same film thickness while holding a same height position and a same vertical length as those of said body layer.

11. The semiconductor device as recited in claim 1, further comprising a drawn electrode portion that is drawn to the outer side than an outer circumferential face of said main pillar at a bottom of said lower portion of said source and drain diffused layers.

12. The semiconductor device as recited in claim 11 further comprising a first wire wired to said front gate electrode and a second wire wired to said drawn electrode portion, said first and second wires being symmetrically arranged at the outer side of said main pillar.

13. The semiconductor device as recited in claim 1 further comprising a third wire wired to said upper portion of said source and drain diffused layers, said third wire being arranged and formed at an upper side of said main pillar.

14. The semiconductor device as recited in claim 1, further comprising:
   a plurality of said back gate electrodes that are provided in parallel in a direction perpendicular to an outer surface of said main pillar; and capacitances that are provided between said back gate electrodes at said upper portion of said source and drain diffused layers.

15. The semiconductor device as recited in claim 1, wherein
said back gate electrode made from a second-conduction-type material is arranged at an outer side of said main pillar, and
said front gate electrode is formed in a pillar shape penetrating from said upper portion to said lower portion at an inner side of said main pillar.

16. The semiconductor device as recited in claim 15, further comprising:
a plurality of said front gate electrodes that are provided in parallel in a direction perpendicular to an outer surface of said main pillar; and
capacitances that are provided between said front gate electrodes at said upper portion of said source and drain diffused layers.

17. A semiconductor device comprising:
a semiconductor substrate;
a body region of the first conductivity type over the semiconductor substrate;
a first diffusion region of the first conductivity type on an upper portion of the body region;
a second diffusion region of the first conductivity type directly beneath a lower portion of the body region, wherein the second diffusion region is in direct contact with the substrate;
a gate insulating film on the body region;
a front gate electrode on the gate insulating film; and
a back gate electrode having a p-n junction with the body region.

18. The semiconductor device according to claim 17, wherein the back gate electrode has a p-n junction with the first diffusion region and the second diffusion region.

19. The semiconductor device according to claim 17, wherein the body region is disposed between the back gate electrode and the front gate electrode.

20. The semiconductor device according to claim 17, wherein the front gate electrode and the back gate electrode do not overlap the first diffusion region and the second diffusion region.

* * * * *